United States Patent
Koyama et al.

(10) Patent No.: US 7,795,617 B2
(45) Date of Patent: Sep. 14, 2010

(54) SEMICONDUCTOR DEVICE, IC CARD, IC TAG, RFID, TRANSPONDER, PAPER MONEY, VALUABLE SECURITIES, PASSPORT, ELECTRONIC DEVICE, BAG, AND CLOTHES

(75) Inventors: Jun Koyama, Kanagawa (JP); Hiroko Abe, Tokyo (JP); Mikio Yukawa, Kanagawa (JP); Yuji Iwaki, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 469 days.

(21) Appl. No.: 11/256,267

(22) Filed: Oct. 24, 2005

(65) Prior Publication Data

US 2006/0097250 A1 May 11, 2006

(30) Foreign Application Priority Data

Oct. 29, 2004 (JP) ............................. 2004-317398

(51) Int. Cl.
*H01L 29/04* (2006.01)
*H01L 29/10* (2006.01)
*H01L 31/00* (2006.01)

(52) U.S. Cl. ............................. 257/59; 257/72; 257/89; 257/E21.414; 257/E21.422; 257/E27.111; 438/30; 438/48; 365/158; 365/157; 345/204; 345/55; 345/87

(58) Field of Classification Search ............ 257/59, 257/72, 89, E21.414, E21.422, E21.682, 257/E21.692, E27.104, E27.111; 434/30, 434/48; 365/157, 158; 345/55, 204, 87
See application file for complete search history.

(56) References Cited

U.S. PATENT DOCUMENTS

| | | | |
|---|---|---|---|
| 5,248,734 A | 9/1993 | Ober et al. | |
| 6,445,612 B1 * | 9/2002 | Naji | 365/158 |
| 6,525,595 B2 | 2/2003 | Oku | |
| 6,777,706 B1 | 8/2004 | Tessler et al. | |
| 6,798,148 B2 * | 9/2004 | Inukai | 315/169.3 |
| 7,279,524 B2 | 10/2007 | Ho et al. | |
| 7,286,122 B2 * | 10/2007 | Jo | 345/204 |
| 2001/0026187 A1 | 10/2001 | Oku | |
| 2002/0158829 A1 * | 10/2002 | Yamazaki et al. | 345/92 |
| 2002/0174153 A1 * | 11/2002 | O'Toole et al. | 708/252 |
| 2003/0151567 A1 * | 8/2003 | Hanada et al. | 345/76 |
| 2006/0050546 A1 * | 3/2006 | Roehr | 365/148 |

FOREIGN PATENT DOCUMENTS

JP 2001-250393 9/2001

OTHER PUBLICATIONS

F. Masuoka, "Rapidly-Advancing Flash Memory," pp. 91-154, published by Kogyochosakai Publishing Co., Ltd., 1st edition, May 2003.
F. Masuoka, "Rapidly-Advancing Flash Memory," pp. 91-154, published by Kogyochosakai Publishing Co., Ltd., May 2003.

* cited by examiner

*Primary Examiner*—Zandra Smith
*Assistant Examiner*—Telly D Green
(74) *Attorney, Agent, or Firm*—Eric J. Robinson; Robinson Intellectual Property Law Office, P.C.

(57) ABSTRACT

It is an object to provide a semiconductor device the data writing of which can be performed except in manufacturing and the counterfeiting of which by rewriting can be prevented. Furthermore, it is another object of the invention to provide a semiconductor device constituted by an organic memory having a simple structure at low cost. A memory cell is constituted by connecting a transistor in parallel or series to an organic element having an organic compound layer, and each memory cell is connected in series or parallel to constitute a NAND memory or a NOR memory. The organic element can change its electrical property irreversibly by application of a current or a voltage, irradiation of light, or the like.

32 Claims, 28 Drawing Sheets

○ : BEFORE SHORT   □ : AFTER SHORT

○ : BEFORE SHORT   □ : AFTER SHORT

○ : BEFORE SHORT     □ : AFTER SHORT

SAMPLE 1

SAMPLE 2

SAMPLE 3

SAMPLE 4

SAMPLE 5

SAMPLE 6

SEMICONDUCTOR DEVICE, IC CARD, IC TAG, RFID, TRANSPONDER, PAPER MONEY, VALUABLE SECURITIES, PASSPORT, ELECTRONIC DEVICE, BAG, AND CLOTHES

BACKGROUND OF THE INVENTION

1. Field of the Invention

The present invention relates to a semiconductor device having an organic element. In particular, the invention relates to a semiconductor device having a memory circuit using an organic element.

2. Description of the Related Art

In accordance with the development of computer technology and improvement of image recognition technology, data recognition using a medium such as a barcode has been widely used, which is used, for example, for data recognition of merchandise. A further larger amount of data recognition is expected to be processed in the future. However, data reading or the like using a barcode is disadvantageous in that a barcode reader is required to contact the barcode and the amount of data stored in a barcode is not very large. Therefore, data recognition without contact and increase of the memory capacity of a medium have been demanded.

In response to such demand, an ID chip using an IC has been developed in recent years. An ID chip stores required data in a memory circuit within an IC chip and the data is read out by using a non-contact means, that is generally a wireless means. It is expected that commercial distribution and the like become simpler, cost thereof be reduced, and high security be provided when the ID chip comes into a practical use.

An overview of an individual recognition system using an ID chip is described with reference to FIG. 4. FIG. 4 illustrates an overview of an individual recognition system for obtaining individual data on a bag without contact. An ID chip 401 storing particular individual data is attached to or embedded in a bag 404. A radio wave is transmitted from an antenna unit 402 of an interrogator (also referred to as a reader/writer) 403 to the ID chip. When receiving the radio wave, the ID chip 401 sends back the individual data thereof to the antenna unit 402. The antenna unit 402 sends the individual data to the interrogator to discriminate it in the interrogator. In this manner, the interrogator can obtain data on the bag 404. Furthermore, this system enables physical distribution management, counting, exclusion of a counterfeit, and the like.

An example of such an ID chip technology is shown in FIG. 2. A semiconductor device 200 used as an ID chip includes an antenna circuit 201, a rectifier circuit 202, a stabilizing power source circuit 203, an amplifier 208, a demodulating circuit 213, a logic circuit 209, a memory control circuit 212, a memory circuit 211, a logic circuit 207, an amplifier 206, and a modulating circuit 205. Further, the antenna circuit 201 includes an antenna coil 301 and a tuning capacitor 302 (FIG. 3A). The rectifier circuit 202 includes diodes 303 and 304 and a smoothing capacitor 305 (FIG. 3B). The portions other than the antenna circuit 201 are called a signal processing circuit 214.

An operation of the ID chip is described below. An AC signal received by the antenna circuit 201 is half-wave rectified by the diodes 303 and 304 and then smoothed by the smoothing capacitor 305. The smoothed voltage containing a number of ripples is stabilized by the stabilizing power source circuit 203, and the stabilized voltage is supplied to the demodulating circuit 213, the amplifier 206, the logic circuit 207, the amplifier 208, the logic circuit 209, the memory circuit 211, and the memory control circuit 212. On the other hand, a signal received by the antenna circuit 201 is inputted to the logic circuit 209 as a clock signal through the amplifier 208. Further, a signal inputted from the antenna is demodulated by the demodulating circuit 213 and inputted as data to the logic circuit 209.

In the logic circuit 209, the inputted data is decoded. The interrogator sends data after having encoded it with a deformation mirror code, an NRZ-L code, or the like and it is decoded by the logic circuit 209. The decoded data is sent to the memory control circuit 212, thereby data stored in the memory circuit 211 is read out. It is necessary that the memory circuit 211 be a nonvolatile memory circuit which is capable of storing data even when the power is OFF, and a mask ROM, an EEPROM, a flash memory, or the like is employed. The stored content is, for example, 16-byte data (see FIG. 12) which includes a 4-byte family code for indicating a series of the ID chip, a 4-byte application code, and two kinds of 4-byte user codes set by a user.

As for a transmitted/received signal, 125 kHz, 13.56 MHz, 915 MHz, 2.45 GHz or the like may be employed, to which the ISO standard or the like is applied. In addition, a modulation and demodulation system in transmission/reception is standardized. An example of such an ID chip is disclosed in Patent Document 1.

In an EEPROM and a flash memory, a transistor has a structure in which gates are overlapped such as a floating gate structure. In the case of using a floating gate in a thin film transistor (hereinafter TFT), the floating gate transistor is structured by a substrate 601, a base film 602, an active layer 603, a first gate insulating film 604, a floating gate 605, a second gate insulating film 606, a control gate 607, an interlayer film 608, a source electrode 609, and a drain electrode 610 as shown in FIG. 6.

A flash memory is constituted by connecting floating gate transistors in series as shown in FIG. 5. In FIG. 5, the flash memory includes floating gate transistors 501 to 512, switches 513 to 518, current sources 519 to 521, a voltage source 522, power source terminals 523 to 527, signal lines 528 to 531, and sense amplifiers 532 to 534. In the case of writing data, a voltage is applied to the floating gate transistors through the switches 513, 515 and 517 from the voltage source 522. Further, the transistors can be selected by controlling the signal lines 528 to 531.

In the case of reading out data, a current is applied to the floating gate transistors through the switches 514, 516 and 518 from the current sources 519 to 521 respectively. A potential at this time is amplified by the sense amplifiers 532 to 534, and then taken out as a signal. Description on a flash memory is made in the following document (see Non-Patent Document 1).

Patent Document 1
  Japanese Patent Laid-Open No. 2001-250393

Non-Patent Document 1
  F. Masuoka, "Rapidly-Advancing Flash Memory", pp. 91-154, published by Kogyochosakai Publishing Co., Ltd.

A conventional semiconductor device for an ID chip, described above has the following problems. In the case of using a mask ROM as a nonvolatile memory, data is written thereinto in a step of manufacturing the chip, and thus no data can be written after manufactured.

An EEPROM and a flash memory are effective as a nonvolatile memory capable of being rewritten. Since these memories store data by holding a charge in a second gate insulating film thereof, the quality of the gate insulating film is required to be high in order to keep the holding capability. However, when the transistor is formed over an insulating substrate such as glass, high-temperature treatment over 600°

C. cannot be performed. Accordingly, the quality of the gate insulating film can be improved only to a limited degree, which makes it difficult to achieve a good nonvolatile memory.

SUMMARY OF THE INVENTION

In view of the foregoing, the invention provides a semiconductor device which is used for an ID chip and has a nonvolatile memory in which a floating gate structure that needs high temperature in manufacturing is not used.

In order to solve the above-described problems, the invention takes the following measure.

A semiconductor device according to the invention includes a plurality of memory cells each having a structure in which an organic element and a transistor are connected in parallel, a plurality of memory cell columns in which the plurality of memory cells are connected in series, and a means for detecting a signal of each memory cell column, provided at one end of each of the plurality of memory cell columns.

A semiconductor device according to the invention includes a plurality of memory cells each having a structure in which an organic element and a transistor are connected in parallel, a plurality of memory cell columns in which the plurality of memory cells are connected in series, and a means for detecting a signal of each memory cell column, provided at one end of each of the plurality of memory cell columns, so that a NAND memory device is configured.

A semiconductor device according to the invention includes a plurality of memory cells each having a structure in which an organic element and a transistor are connected in series, a plurality of memory cell columns in which the plurality of memory cells are connected in parallel, and a means for detecting a signal of each memory cell column, provided at one end of each of the plurality of memory cell columns.

A semiconductor device according to the invention includes a plurality of memory cells each having a structure in which an organic element and a transistor are connected in series, a plurality of memory cell columns in which the plurality of memory cells are connected in parallel, and a means for detecting a signal of each memory cell column, provided at one end of each of the plurality of memory cell columns, so that a NOR memory device is configured.

In the foregoing, the organic element has an organic compound layer, and the organic compound layer is formed using an electron-transporting material or a hole-transporting material.

In the foregoing, the organic element has an organic compound layer, and the organic compound layer contains a material the electric resistance of which is varied when irradiated with light.

In the foregoing, the organic compound layer varies its conductivity when irradiated with laser light.

In the foregoing, the organic element has an organic compound layer, and the organic compound layer contains a material the electric resistance of which is varied when a voltage or a current is applied thereto.

In the foregoing, the organic element varies its electric resistance irreversibly when data is written thereto.

In the foregoing, the organic element varies the distance between electrodes thereof when data is written thereto.

In the foregoing, the conductivity of the organic compound layer is in the range of $10^{-15}$ to $10^{-3}$ S/cm$^{-1}$.

In the foregoing, the thickness of the organic compound layer is 5 to 60 nm, and preferably 10 to 20 nm.

In the foregoing, the organic element and the transistor are provided over a semiconductor substrate.

In the foregoing, the organic element and the transistor are provided over a glass substrate.

In the foregoing, the organic element and the transistor are provided over a flexible substrate.

In the foregoing, the organic element and the transistor are provided over an SOI substrate.

In the foregoing, the transistor includes a thin film transistor.

The invention relates to an IC card, an IC tag, an RFID, a transponder, paper money, valuable securities, a passport, an electronic device, a bag, and clothes, each having the above-described semiconductor device.

The invention relates to an RFID having the above-described semiconductor device and having at least one of a power source circuit, a clock generating circuit, a data demodulating circuit, a data modulating circuit, a control circuit, and an interface circuit.

As set forth above, according to the invention, a semiconductor device having a nonvolatile memory can be manufactured without using a high-performance gate insulating film formed at low temperature.

DETAILED DESCRIPTION OF THE INVENTION

Figure 1:
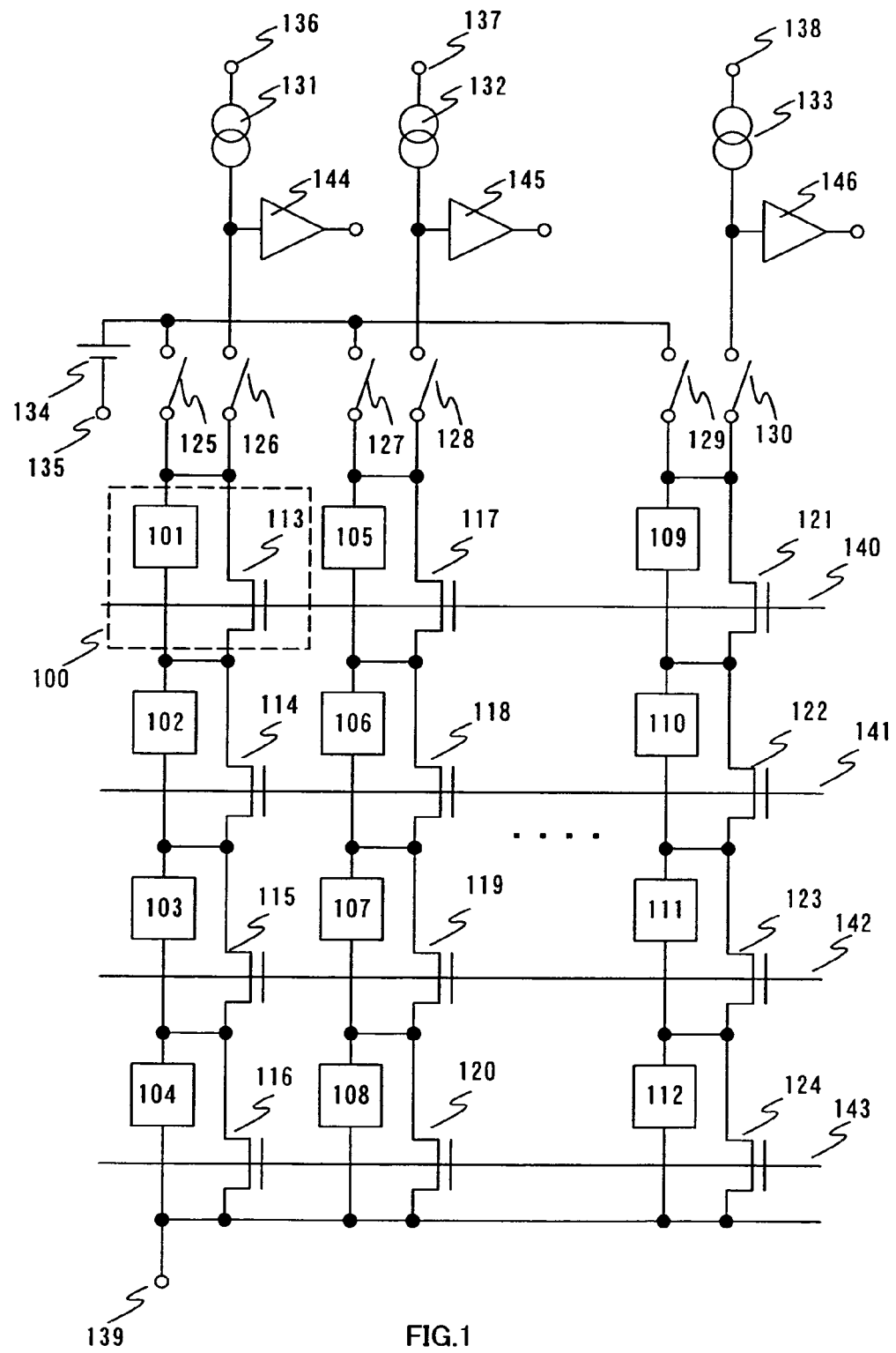
FIG. 1 is a block diagram showing a memory using an organic element of the invention.
Figure 2:
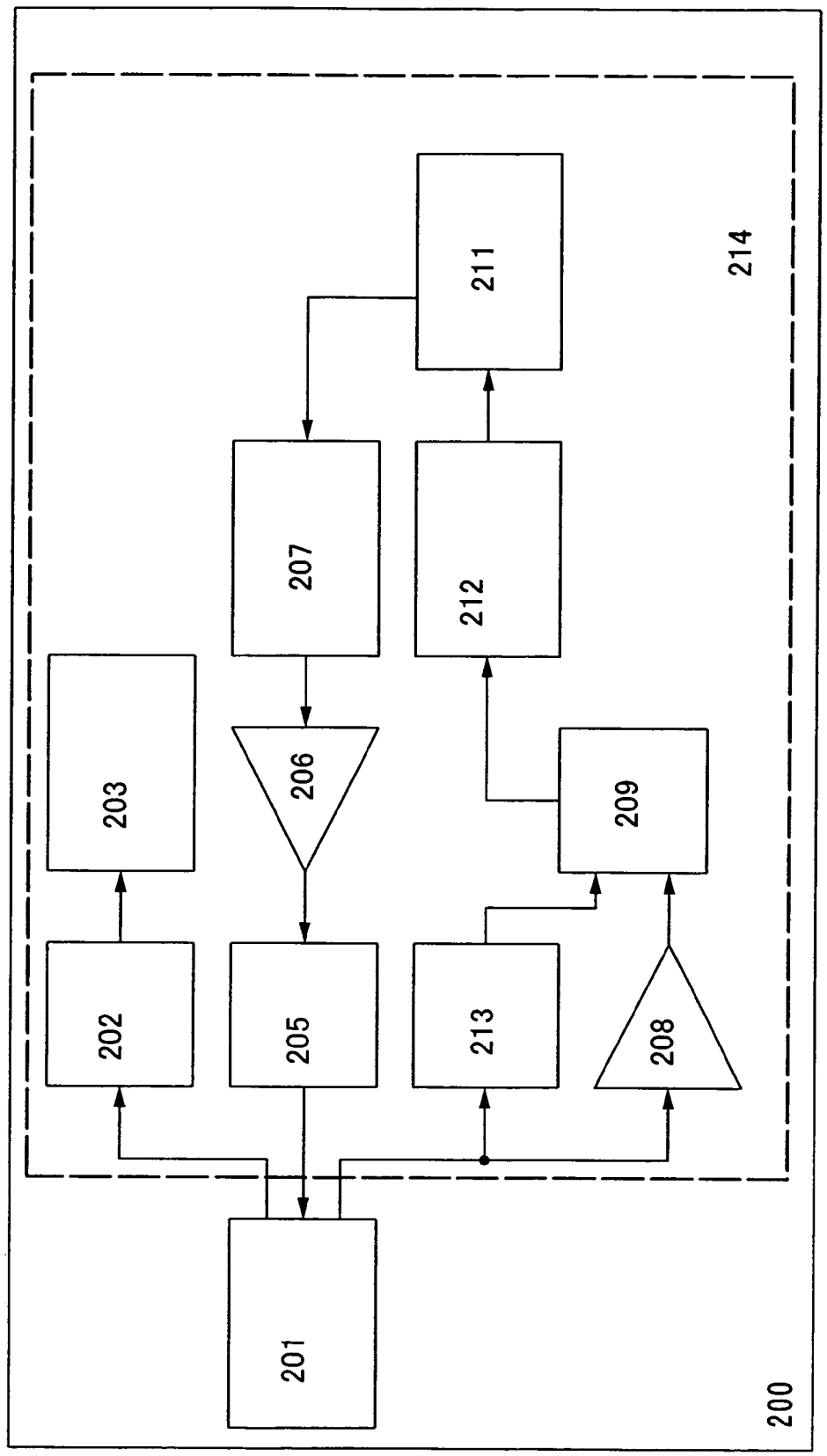
FIG. 2 is a block diagram showing constitution of a conventional semiconductor device.
Figure 3A:
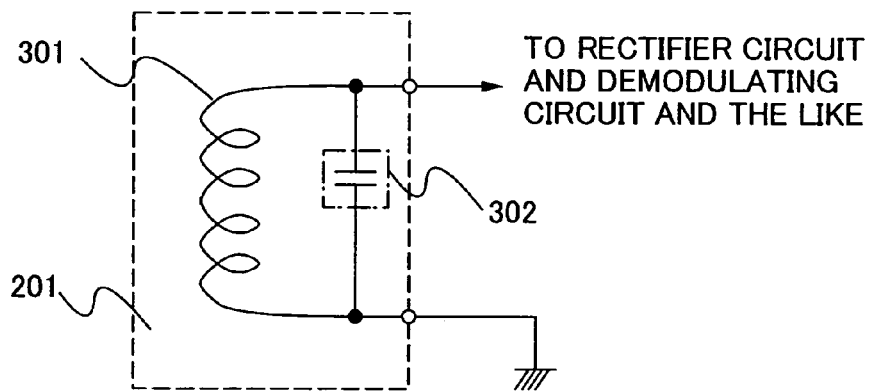
FIGS. 3A and 3B are block diagrams showing a configuration of the conventional semiconductor device.
Figure 3B:
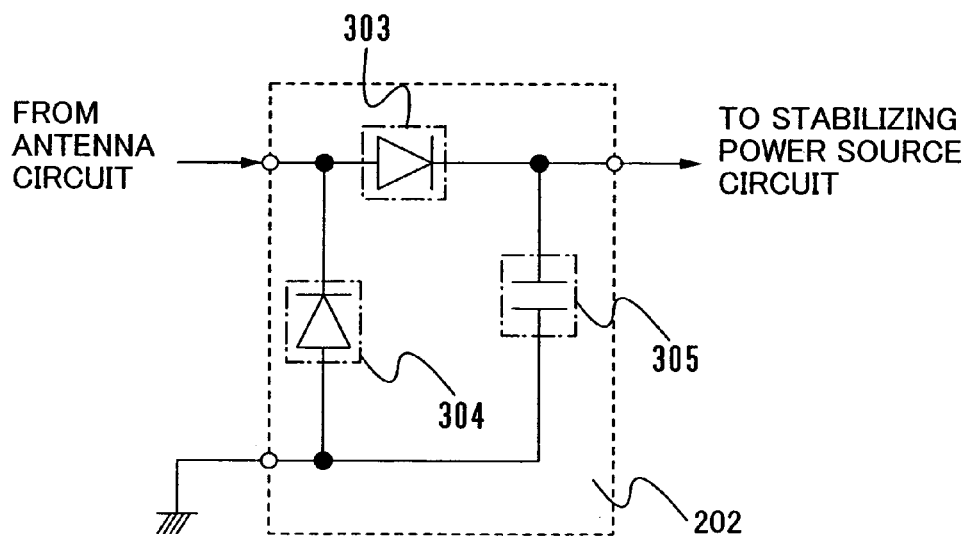
Figure 4:
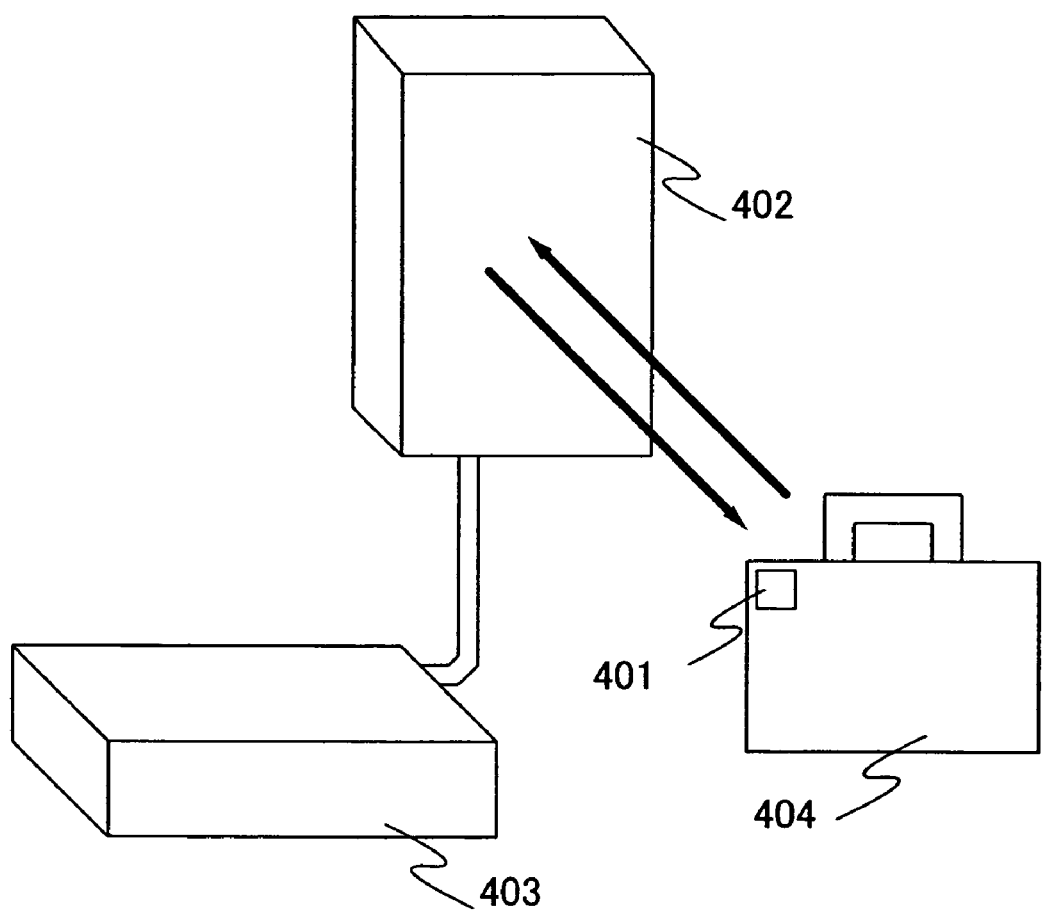
FIG. 4 is a diagram showing an overview of an RF tag system.
Figure 5:
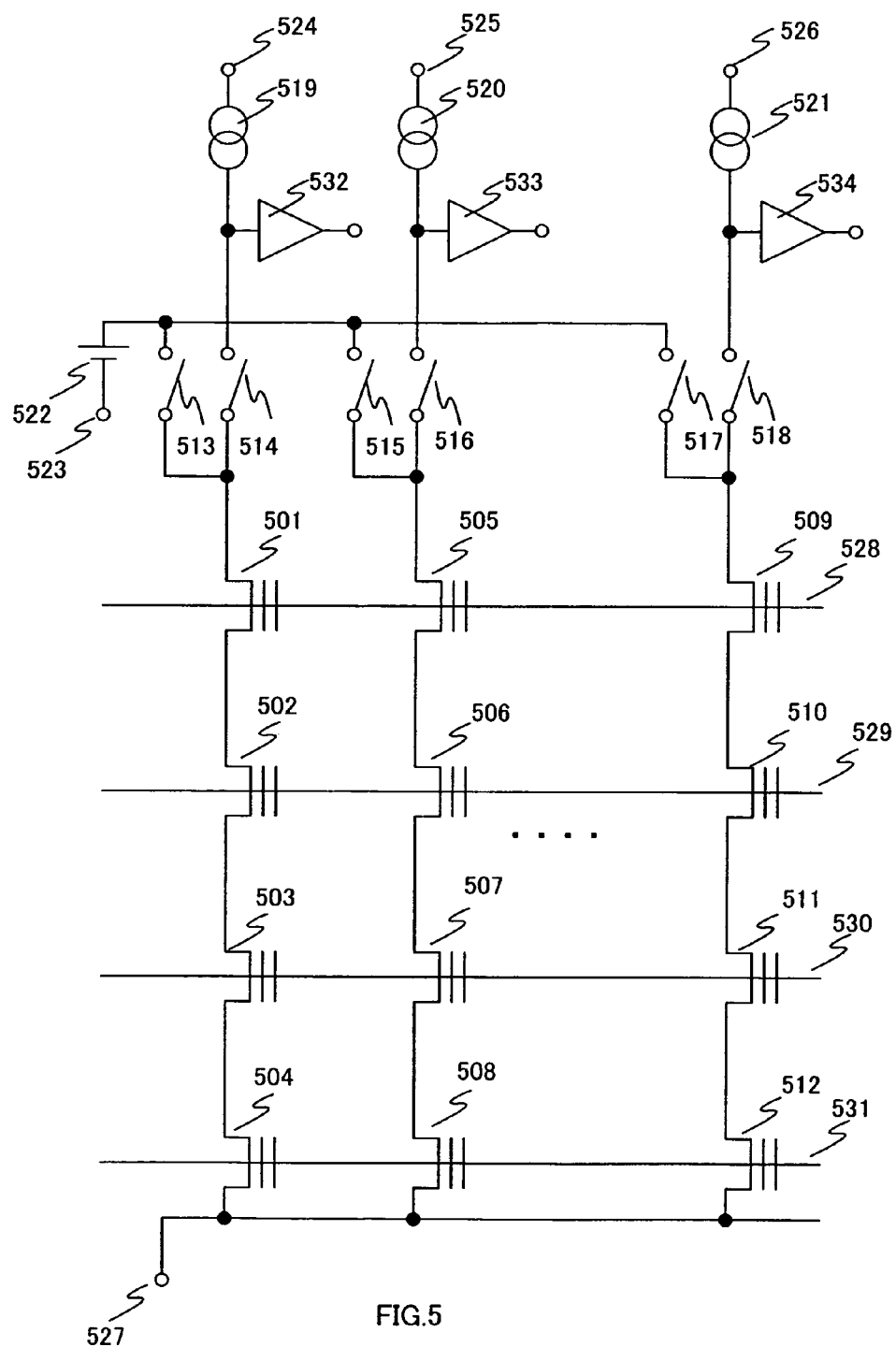
FIG. 5 is a diagram showing a configuration of a conventional NAND flash memory.
Figure 6:
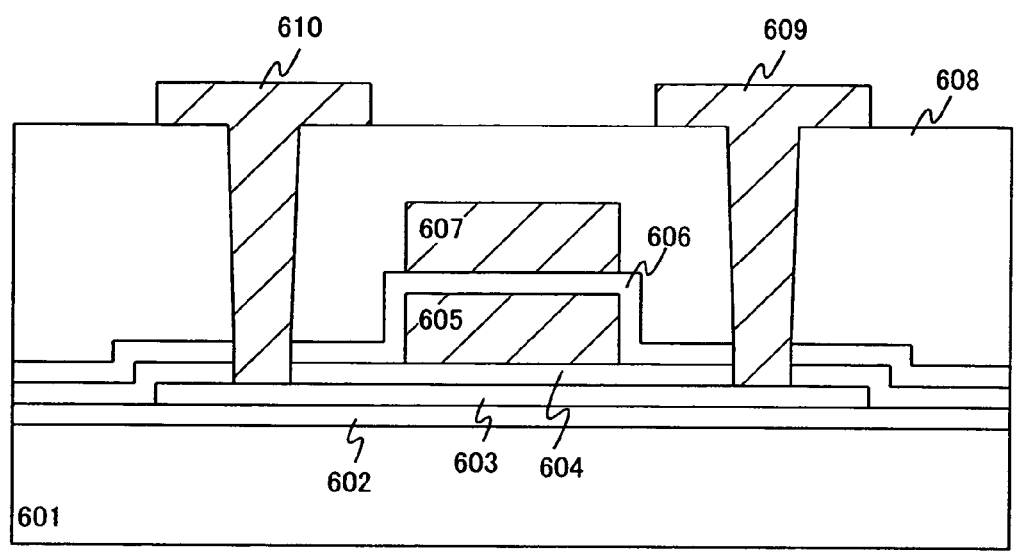
FIG. 6 is a diagram showing a floating gate structure.

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. In the accompanying drawings, the same portions or portions having the same function are denoted by the same reference numerals, and the description thereof is not repeated.

Figure 7A:
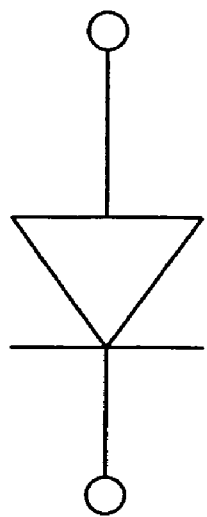
FIGS. 7A and 7B are diagrams each showing an equivalent circuit of an organic element.
Figure 7B:

FIG. 1 shows a first embodiment mode of the invention. An embodiment mode shown in FIG. 1 is a circuit configured by organic elements 101 to 112, transistors 113 to 124, switches 125 to 130, current sources 131 to 133, a power source 134, power source terminals 135 to 139, signal lines 140 to 143, and sense amplifiers 144 to 146. Although the transistors 113 to 124 are preferably thin film transistors, the invention is not limited to this. The organic element 101 and the transistor 113 are connected in parallel, which constitutes a memory cell 100. The other organic elements and transistors are provided similarly to this. The organic element used here has two modes; for example, a first mode is a mode an equivalent circuit of which can be shown by a diode as shown in FIG. 7A, and when a voltage, a current, light (including laser light) or the like is applied to the first-mode organic element, it irreversibly changes to a second mode an equivalent circuit of which can be shown by a resistor as shown in FIG. 7B.

An operation of the circuit shown in FIG. 1 is described below. The description is made on the case of using the circuit as a memory circuit. First, a method for storing data in the organic elements 101 to 112 is described. The case of storing data in the organic element 101 is considered below.

First, the signal lines 141 to 143 are selected, so that the transistors 114 to 116, 118 to 120, and 122 to 124 are turned on and respective sources and drains thereof are shorted, and thus respective potentials thereof become almost the same as that of the power source terminal 139. The signal line 140 is, on the other hand, not selected, so that the transistors 113, 117, and 121 are turned off.

Next, the switch 125 is turned on. Accordingly, one terminal of the organic element 101 is applied a potential of the power source 134, while the other terminal thereof is applied the potential of the power source terminal 139. By applying the voltage of the power source 134 which is high enough to change the mode of the organic element, the organic element 101 has low resistance and is shorted.

The case of reading out data stored in the organic element 101 is described next. First, the signal lines 141 to 143 are selected so that the transistors 114 to 116, 118 to 120, and 122 to 124 are turned on and respective sources and drains thereof are shorted, and thus respective potentials thereof become almost the same as that of the power source terminal 139. The signal line 140 is, on the other hand, not selected, so that the transistors 113, 117, and 121 are turned off. Next, the switch 126 is turned on. A current flows from the current source 131 connected to the power source terminal 136 to the organic element 101 through the switch 126, and continuously flows to the power source terminal 139 through the transistors 114, 115, and 116. If the on-resistance of the transistors 114, 115, and 116 is sufficiently low, and besides, if the resistance of the organic element after the mode has changed is sufficiently low, a terminal of the current source 131 opposite to the terminal connected to the power source terminal 136 has almost the same potential as that of the power source terminal 139.

In the case where no data is stored in the organic element, the organic element is in the sate of the diode shown in FIG. 7A. If a current flows to the organic element 101, a voltage in which a forward voltage of the diode is added to a voltage of the power source terminal 139 is generated in the terminal of the current source 131 opposite to the terminal connected to the power source terminal 136. In this manner, the potential of the terminal of the current source 131 opposite to the terminal connected to the power source terminal is different depending on whether data is stored or not, thereby the stored state of the organic element can be read out. By checking an output of the sense amplifier 144 connected to the current source 131, the stored state can be clearly judged.

Description on the organic element 101 is made up to this point. Similarly, in the case of writing data to the organic element 102, the signal lines 140, 142, and 143 are selected, the switch 125 is turned on, and a voltage is applied to both terminals of the organic element 102, thereby the mode of the organic element is changed so that data can be stored. Typically, the distance between two electrodes thereof varies and the thickness of the organic compound layer partially varies. In the case of reading out data stored in the organic element 102 also, the signal lines 140, 142, and 143 are selected, the switch 126 is turned on, and a potential of the current source 131 is read so that the stored state can be read out; and the stored state can be judged more clearly by checking an output of the sense amplifier 144. Data can be stored in the organic elements 103 and 104 similarly.

Up to this point, description is made on a column of the organic elements 101 to 104, and the description can also be applied to a column of the organic elements 105 to 108, and a column of the organic elements 109 to 112. In addition, although four organic elements are connected in series in FIG. 1, the number of the organic elements is not limited to four. In the foregoing, an organic element and a transistor are connected in parallel to constitute a memory cell, each memory cell is connected in series to form a NAND memory structure, and a means (a sense amplifier herein, and it is not limited to a sense amplifier) for detecting a signal from one end of the memory cell column is provided.

Figure 21:
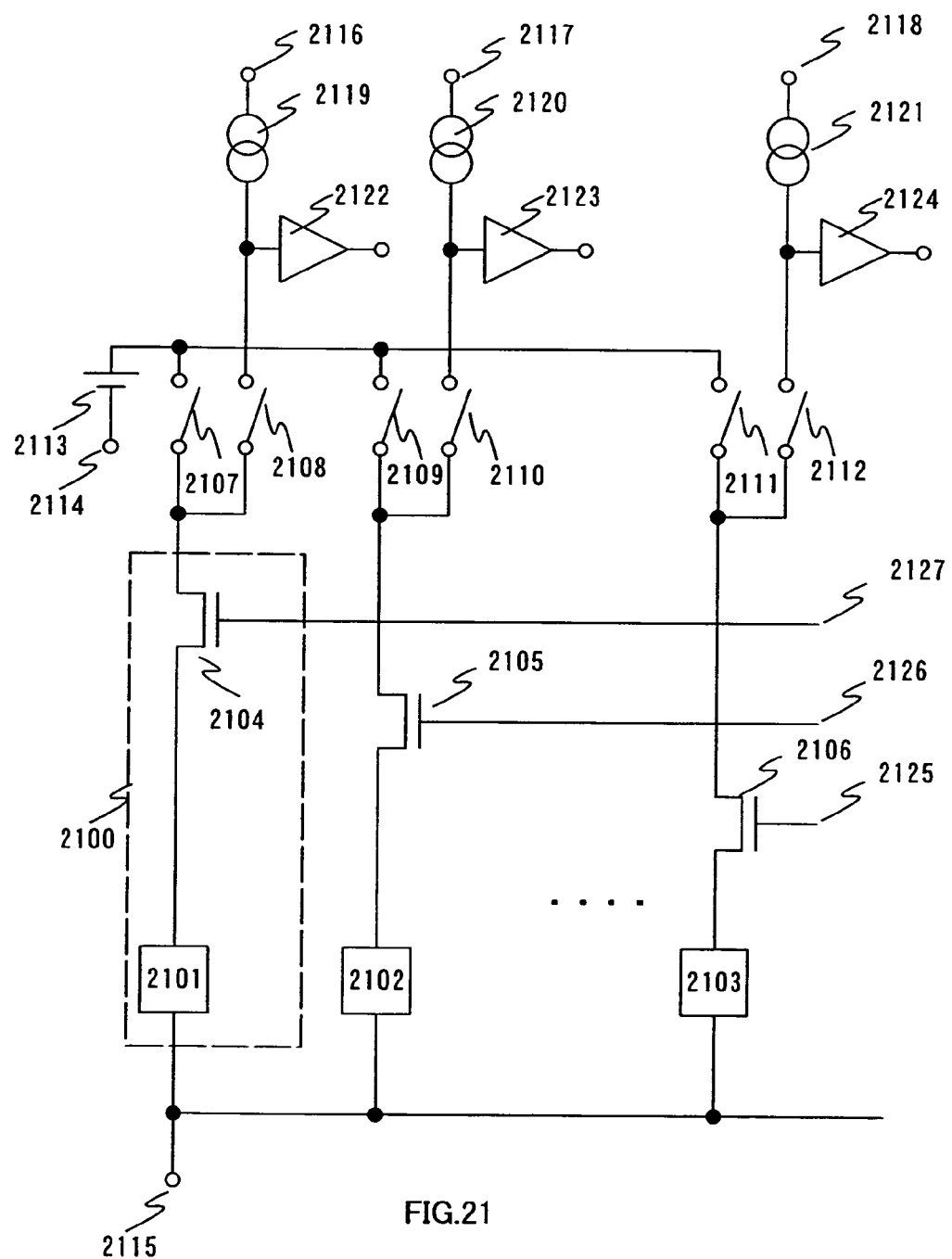
FIG. 21 is a diagram showing a configuration of a NOR organic memory of the invention.

FIG. 21 shows a second embodiment mode of the invention. An embodiment mode shown in FIG. 21 is a circuit configured by organic elements 2101 to 2103, transistors 2104 to 2106, switches 2107 to 2112, current sources 2119 to 2121, a power source 2113, power source terminals 2114 to 2118, sense amplifiers 2122 to 2124, and signal lines 2125 to 2127. Although the transistors 2104 to 2106 are preferably thin film transistors, the invention is not limited to this. The organic element 2101 and the transistor 2104 are connected in series, which constitutes a memory cell 2100. The other organic elements and transistors are provided similarly to this. The organic element used here has two modes; for example, a first mode is a mode an equivalent circuit of which can be shown by a diode as shown in FIG. 7A, and when a voltage, a current, light (including laser light) or the like is applied to the first-mode organic element, it irreversibly changes to a second mode an equivalent circuit of which can be shown by a resistor as shown in FIG. 7B.

An operation of the circuit shown in FIG. 21 is described below. The description is made on the case of using the circuit as a memory circuit. First, a method for storing data in the organic elements 2101 to 2103 is described. Data is to be stored in the organic element 2101 below.

First, the signal line 2127 is selected, so that the transistor 2104 is turned on and a source and a drain thereof are shorted, and the organic element 2101 is connected to the switches 2107 and 2108. The signal lines 2126 and 2127 are, on the other hand, not selected, so that the transistors 2105 and 2106 are turned off.

Next, the switch 2107 is turned on. Accordingly, one terminal of the organic element 2101 is applied a potential of the power source 2113, while the other terminal thereof is applied a potential of the power source terminal 2115. By applying a voltage large enough to change the mode of the organic element as the voltage of the power source 2113, the organic element 2101 has low resistance and is shorted.

The case of reading out data stored in the organic element 2101 is described next. First, the signal line 2127 is selected so that the transistor 2104 is turned on and the source and the drain thereof are shorted, and thus a potential thereof becomes almost the same as that of the power source terminal 2115. The signal lines 2125 and 2126 are, on the other hand, not selected, so that the transistors 2105 and 2106 are turned off. Next, the switch 2108 is turned on. A current flows from the current source 2119 connected to the power source terminal 2116 to the organic element 2101 through the switch 2108, and continuously flows to the power source terminal 2115. If the on-resistance of the transistor 2104 is sufficiently low, and besides, if the resistance of the organic element after the mode has changed is sufficiently low, a terminal of the current source 2119 opposite to the terminal connected to the power source terminal 2116 has almost the same potential as that of the power source terminal 2115.

In the case where no data is stored in the organic element, the organic element is in the state of the diode shown in FIG. 7A. If a current flows to the organic element 2101, a voltage in which a forward voltage of the diode is added to a voltage of the power source terminal 2115 is generated in the terminal of the current source 2119 opposite to the terminal connected to the power source terminal 2116. In this manner, the potential of the terminal of the current source 2119 opposite to the terminal connected to the power source terminal is different depending on whether data is stored or not, thereby the stored state of the organic element can be read out. By checking an output of the sense amplifier 2122 connected to the current source 2119, the stored state can be clearly judged.

Description on the organic element 2101 is made up to this point. Similarly, in the case of writing data to the organic element 2102, the signal line 2126 is selected, the switch 2109 is turned on, and a voltage is applied to both terminals of the organic element 2102, thereby the mode of the organic element is changed so that data can be stored. In the case of reading out data stored in the organic element 2102 also, the signal line 2126 is selected, the switch 2110 is turned on, and a potential of the current source 2120 is read so that the stored state can be read out; and the stored state can be judged more clearly by checking an output of the sense amplifier 2123. Data can be stored in the organic element 2103 similarly.

Although three organic elements are shown in FIG. 21, the number of the organic elements is not limited to three. In the foregoing, an organic element and a transistor are connected in series to constitute a memory cell, each memory cell is connected in parallel to form a NOR memory structure, and a means (a sense amplifier herein, and it is not limited to a sense amplifier) for detecting a signal from one end of the memory cell column is provided.

Embodiment 1

Figure 22:
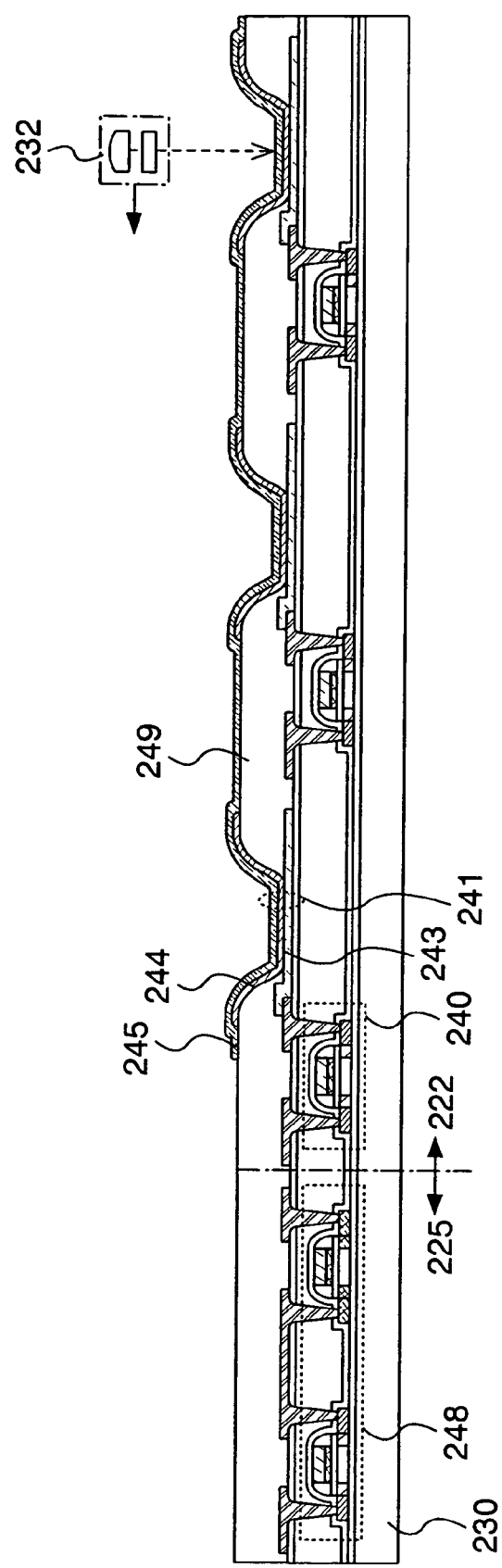
FIG. 22 is a cross-sectional view of the invention.

A cross-sectional structure of a semiconductor device of the invention is described (see FIG. 22). Shown herein is a cross-sectional structure of a transistor 240 and an organic element 241 included in a memory array 222, and a CMOS circuit 248 included in a switch, a sense amplifier, or the like (denoted by 225 in FIG. 22). As for a substrate 230 of the invention, a quartz substrate, a silicon substrate, a metal substrate, a stainless substrate, or the like is used as well as a glass substrate or a flexible substrate. A flexible substrate means a substrate capable of being flexibly bent, such as a plastic substrate formed using polycarbonate, polyarilate, polyether sulfone, or the like.

The organic element 241 corresponds to a stack of a first conductive layer 243, an organic compound layer 244, and a second conductive layer 245, and an insulating layer 249 is provided between the adjacent organic elements 241. FIG. 22 shows an example of a NOR memory circuit, and the second conductive layer is common among organic elements.

The first conductive layer 243 and the second conductive layer 245 are formed using a known conductive material such as aluminum (Al), copper (Cu), or silver (Ag).

When the data writing is performed by an optical function, one or both of the first conductive layer 243 and the second conductive layer 245 are formed using a light-transmissive material such as indium tin oxide (ITO) or with a thickness to transmit light. Meanwhile, when the data writing is performed by an electronic function, the material for the first conductive layer 243 and the second conductive layer 245 is not particularly limited.

The organic compound layer 244 can have a single-layer structure or a stacked-layer structure. It is to be noted that the total thickness of the organic compound layer 244 is 5 to 60 nm, and preferably 10 to 20 nm. The conductivity of each organic compound layer is in the range of $10^{-15}$ to $10^{-3}$ S/cm$^{-1}$.

When an organic compound material is used for the organic compound layer 244, data writing is performed by means of an optical function such as laser light or an electronic function. Alternatively, when a conjugated polymer material doped with a photo-acid generator is used, data writing is performed by means of an optical function. Data reading is performed by means of an electronic function in any cases regardless of the material for the organic compound layer 244.

Subsequently, data writing by means of an optical function is described. In this case, the organic compound layer 244 is irradiated with laser light from a laser irradiation apparatus 232 from a light-transmissive conductive layer side (the second conductive layer 245 herein).

When an organic compound material is used for the organic compound layer 244, the laser light irradiation oxidizes or carbonizes the organic compound layer 244 to be insulated. Consequently, the resistance value of the laser-irradiated organic element 241 increases while that of the non-laser-irradiated organic element 241 does not change. On the other hand, when a conjugated polymer material doped with a photo-acid generator is used, the laser light irradiation imparts the conductivity to the organic compound layer 244. That is, the conductivity is imparted to the laser-irradiated organic element 241 while it is not imparted to the non-laser-irradiated organic element 241.

Embodiment 2

When data writing is performed by means of light, one or both of the first conductive layer 243 and the second conductive layer 245 transmit light. The conductive layer which transmits light is formed using a light-transmissive conductive material such as indium tin oxide (ITO) or formed with a thickness to transmit light even if the material is not a light-transmissive conductive material.

For the organic compound layer 244, an organic compound material having conductivity can be used, and for example, substances which have high hole-transporting property can be used; namely, an aromatic amine compound (that is, a compound containing a bond of benzene ring—nitrogen) such as 4,4'-bis[N-(1-naphthyl)-N-phenyl-amino]-biphenyl (abbreviated to α-NPD), 4,4'-bis[N-(3-methylphenyl)-N-phenyl-amino]-biphenyl (abbreviated to TPD), 4,4',4"-tris(N, N-diphenyl-amino)-triphenylamine (abbreviated to TDATA), 4,4',4"-tris[N-(3-methylphenyl)-N-phenyl-amino]-triphenylamine (abbreviated to MTDATA), and 4,4'-bis(N-(4-(N,N-di-m-tolylamino)phenyl)-N-phenylamino)biphenyl (abbreviated to DNTPD), a phthalocyanine compound such as phthalocyanine (abbreviated to H2Pc), copper phthalocyanine (abbreviated to CuPc), and vanadyl-phthalocyanine (abbreviated to VOPc), or the like.

In addition, an organic compound material having high electron-transporting property can be used as well; for example, a material formed of a metal complex having a quinoline or benzoquinoline skeleton such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), and bis(2-methyl-8-quinolinolate)-4-phenylphenolato-aluminum (abbreviated to BAlq), a metal complex having an oxazole or thiazole ligand such as bis[2-(2-hydroxyphenyl)benzooxazolate]zinc (abbreviated to $Zn(BOX)_2$) and bis[2-(2-hydroxyphenyl)benzothiazolate]zinc (abbreviated to $Zn(BTZ)_2$), or the like. Other than the metal complex, the following compounds can be used; 2-(4-biphenyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), and the like.

As other organic compound materials, the following can be used as well; 4-dicyanomethylene-2-methyl-6-(1,1,7,7-tetramethyljulolidin-9-enyl)-4H-pyran (abbreviated to DCJT), 4-dicyanomethylene-2-t-butyl-6-(1,1,7,7-tetramethyljulolidin-9-enyl)-4H-pyran, periflanthene, 2,5-dicyano-1,4-bis(10-methoxy-1,1,7,7-tetramethyljulolidin-9-enyl)benzene, N,N'-dimethylquinacridone (abbreviated to DMQd), coumarin 6, coumarin 545T, tris(8-quinolinolato)aluminum (abbreviated to $Alq_3$), 9,9'-bianthryl, 9,10-diphenylanthracene (abbreviated to DPA), 9,10-bis(2-naphthyl)anthracene (abbreviated to DNA), 2,5,8,11-tetra-t-butylperylene (abbreviated to TBP), or the like. Then, as a host material for forming a layer in which the above-described light emitting material is dispersed, the following can be used; an anthracene derivative such as 9,10-di(2-naphthyl)-2-tert-butylanthracene (abbreviated to t-BuDNA), a carbazole derivative such as 4,4'-bis(N-carbazolyl)biphenyl (abbreviated to CBP), a metal complex such as bis[2-(2-hydroxyphenyl)pyridinato]zinc (abbreviated to $Znpp_2$) and bis[2-(2-hydroxyphenyl)benzooxazolate]zinc (abbreviated to ZnBOX), or the like. Alternatively, tris(8-quinolinolato)aluminum (abbreviated to $Alq_3$), 9,10-bis(2-naphthyl)anthracene (abbreviated to DNA), bis(2-methyl-8-quinolinolate)-4-phenylphenolato-aluminum (abbreviated to BAlq), or the like.

Further, as a material for the organic compound layer, such a material that the electric resistance thereof is varied by means of an optical or electronic function can be used as well. For example, a conjugated polymer doped with a compound which generates acidum by absorbing light (a photo-acid generator) can be used. As the conjugated polymer here, polyacetylene, polyphenylene vinylene, polythiophene, polyaniline, polyphenylene ethylene, or the like can be used. As the photo-acid generator, arylsulfonium salts, aryliodonium salts, o-nitrobenzyl tosylate, arylsulfonic acid p-nitrobenzyl ester, sulfonyl acetophenone, Fe-arene complex PF6 salts, or the like can be used.

Since the above-described organic element 241 has a simple structure in which an organic compound layer is provided between a pair of conductive layers, the manufacturing process thereof is simple and a semiconductor device can be provided at low cost. Further, since the organic element 241 is a nonvolatile memory, a battery for holding data is not required to be incorporated, and thus a small, thin, and lightweight semiconductor device can be provided. In addition, by forming the organic element 241 using an irreversible material, data writing (additional writing) can be performed whereas data rewriting cannot be performed. Accordingly, a semiconductor device can be provided where the counterfeiting is prevented and the security is protected.

Embodiment 3

Next, data writing by means of an optical function is described. In this case, the organic compound layer 244 is irradiated with laser light from a light-transmissive conductive layer side (the second conductive layer 245 herein). Here, the organic compound layer 244 at a desired portion is selectively irradiated with the laser light to destroy the organic compound layer 244. The destroyed organic compound layer 244 is insulated, and thus the electric resistance thereof becomes considerably large compared to that of the other portion. Data writing is performed by utilizing the phenomenon that the electric resistance between two conductive films provided with the organic compound layer 244 interposed therebetween varies by the laser irradiation in this manner. For example, provided that a non-laser-irradiated organic compound layer has data of '0', in order to write data of '1', the electric resistance is increased by selectively irradiating the organic compound layer at a desired portion with laser light to be destroyed.

On the other hand, when a conjugated polymer material doped with a compound which generates acidum by absorbing light (a photo-acid generator) is used for the organic compound layer 244, the laser light irradiation increases the conductivity of only a laser light-irradiated portion, and non-irradiated portion does not have the conductivity. Therefore, the data writing is performed by utilizing the phenomenon that the conductivity of an organic compound layer is varied by selectively irradiating the organic compound layer at a desired portion with laser light. For example, provided that a non-laser-irradiated organic compound layer has data of '0', in order to write data of '1', the conductivity is increased by selectively irradiating the organic compound layer at a desired portion with laser light.

In the case of irradiating laser light, the change of the electric resistance of the organic compound layer 244 is achieved by irradiation of laser light of which diameter is in the order of μm although it depends on the size of the memory cell. For example, when a laser beam of which diameter is 1 μm passes at a linear velocity of 10 m/sec, the laser irradiation time of a layer containing an organic compound included in one memory cell corresponds to 100 nsec. In order to change the phase in a time as short as 100 nsec, it is preferable that a laser power be set to 10 mW and a power density be set to 10 kW/mm². When the layer is selectively irradiated with the laser light, a pulse laser light irradiation apparatus is preferably used.

Figure 23:
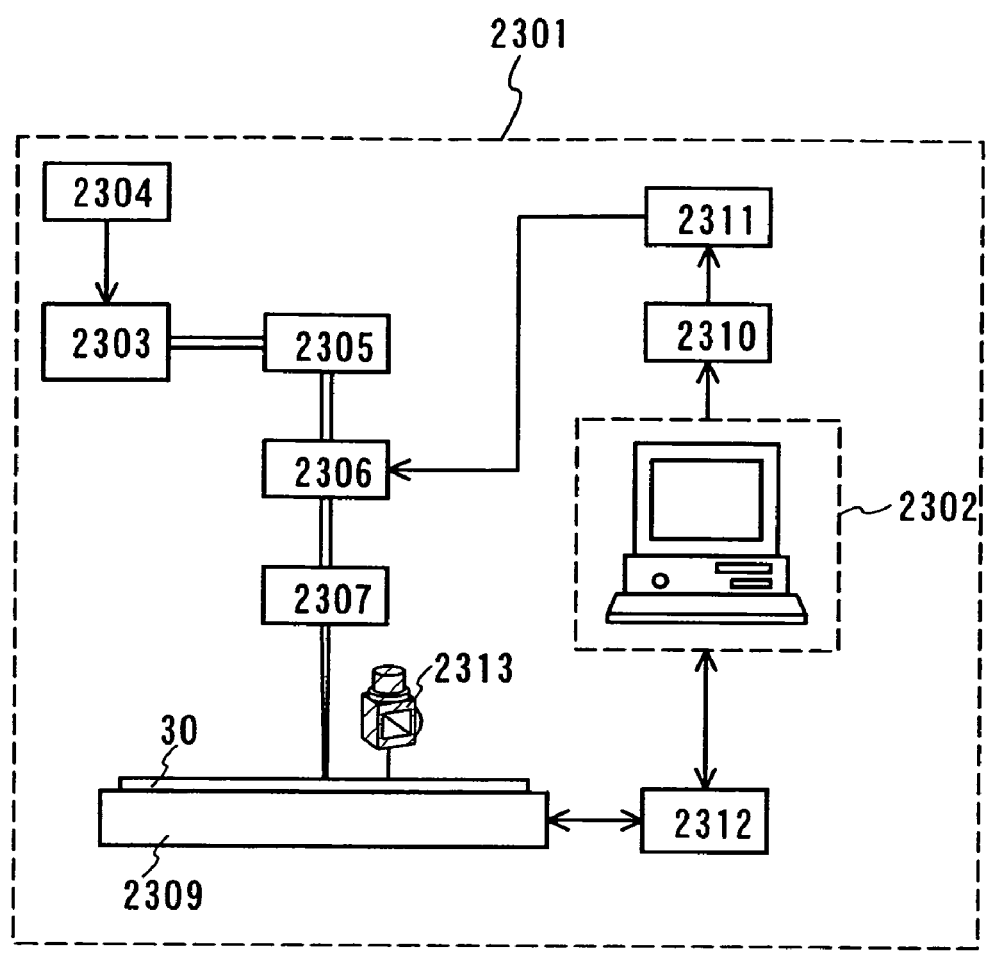
FIG. 23 is a diagram showing a laser apparatus used in the invention.

An example of a laser irradiation apparatus is briefly described here with reference to FIG. 23. A laser irradiation apparatus 2301 includes a computer (hereinafter denoted by PC) 2302 for carrying out various control for laser light irradiation, a laser oscillator 2303 for outputting laser light, a power source 2304 for the laser oscillator 2303, an optical system (ND filter) 2305 for attenuating laser light, an acousto-optic modulator (AOM) 2306 for modulating the intensity of laser light, an optical system 2307 constituted by a lens for reducing a cross-section of laser light, a mirror for changing a light path, and the like, a movement mechanism 2309 having an X-axis stage and a Y-axis stage, a D/A converter portion 2310 for converting control data outputted from the PC from digital to analog, a driver 2311 for controlling the acousto-optic modulator 2306 in accordance with an analog voltage outputted from the D/A converter portion, a driver 2312 for outputting a driving signal for driving the movement mechanism 2309, and an auto-focusing mechanism 2313 for focusing laser light on an irradiated object.

As the laser oscillator 2303, a laser oscillator capable of oscillating ultraviolet light, visible light, or infrared light can be used. Specifically, the following laser oscillator can be used: an excimer laser oscillator such as KrF, ArF, XeCl and Xe; a gas laser oscillator such as He, He—Cd, Ar, He—Ne and HF; a solid laser oscillator using a crystal such as YAG, GdVO$_4$, YVO$_4$, YLF and YAlO$_3$ in which Cr, Nd, Er, Ho, Ce, Co, Ti or Tm is doped; and a semiconductor laser oscillator such as GaN, GaAs, GaAlAs and InGaAsP. Note that, in the solid laser oscillator, a fundamental wave or a second to fifth harmonic wave is preferably used.

Subsequently, a method for irradiation with the laser irradiation apparatus is described. When a substrate 30 provided with an organic compound layer (not shown) is mounted on the movement mechanism 2309, the PC 2302 detects a position of an organic compound layer to be irradiated with laser light, with a camera not shown in the diagram. Next, the PC 2302 generates movement data for moving the movement mechanism 2309 based on the detected data on the position.

Thereafter, the PC 2302 controls the amount of output light of the acousto-optic modulator 2306 through the driver 2311. Accordingly, after laser light outputted from the laser oscillator 2303 is attenuated by the optical system 2305, it is controlled by the acousto-optic modulator 2306 to have the predetermined amount. On the other hand, the optical system 2307 changes a light path and a beam spot shape of the laser beam outputted from the acousto-optic modulator 2306, and then the laser beam is collected by the lens so that the substrate 30 is irradiated with the laser beam.

At this time, the movement mechanism 2309 is controlled to move in an X direction and a Y direction in accordance with the movement data generated by the PC 2302. Consequently, a predetermined portion is irradiated with the laser light, the light energy of the laser light is converted into the thermal energy, and the organic compound layer provided over the substrate 30 can be selectively irradiated with the laser light. Note that although the laser light irradiation is performed while moving the movement mechanism 2309 in this embodiment, the laser light can be moved in an X direction and a Y direction by controlling the optical system 2307.

According to the invention in which data writing is performed by laser light irradiation as described above, a semiconductor device can be manufactured easily and in large quantity. Accordingly, a semiconductor device can be provided at low cost.

Embodiment 4

In this embodiment, an organic element is formed over a substrate, and a result of the case where data is written to the organic element by means of an electronic function is described.

The organic element is structured by stacking a first conductive layer, a first organic compound layer, a second organic compound layer, and a second conductive layer in this order over a substrate; in which the first conductive layer is formed using a compound of silicon oxide and indium tin oxide (it may be abbreviated to ITSO), the first organic compound layer is formed using 4,4'-bis[N-(3-methylphenyl)-N-phenyl-amino]-biphenyl (it may be abbreviated to TPD), the second organic compound layer is formed using 4,4'-bis[N-(1-naphthyl)-N-phenyl-amino]-biphenyl (it may be abbreviated to α-TPD), and the second conductive layer is formed using aluminum. The first organic compound layer is formed with a thickness of 10 nm and the second organic compound layer is formed with a thickness of 50 nm. It is to be noted that the total thickness of the organic compound layers is 5 to 60 nm and is preferably 10 to 20 nm, and the conductivity of each organic compound layer is in the range of $10^{-15}$ to $10^{-3}$ S/cm$^{-1}$.

First, a measurement result of a current-voltage characteristic of the organic element before data writing is performed by an electronic function and after the data writing is performed is described with reference to FIG. 8.

Figure 8:
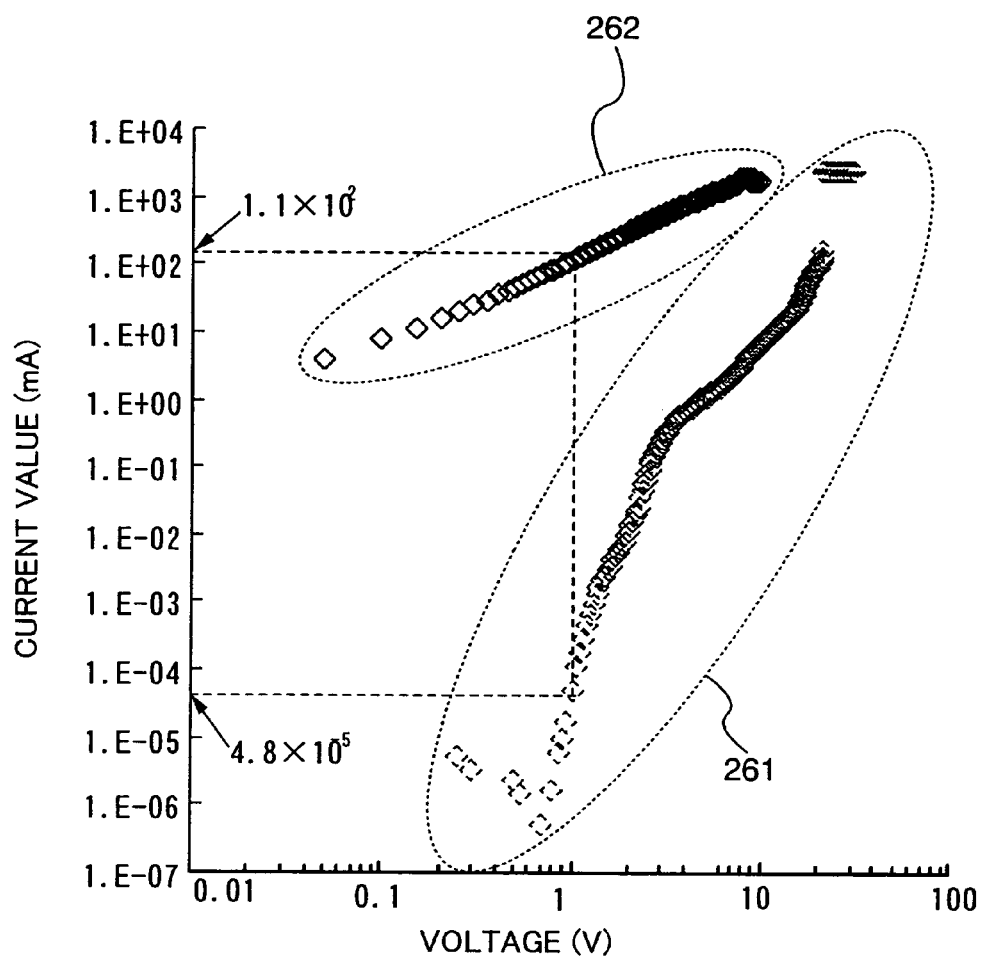
FIG. 8 is a diagram showing data on an organic element of the invention.

In FIG. 8, the abscissa indicates a voltage value, the ordinate indicates a current value, a plot 261 shows a current-voltage characteristic of the organic element before data writing is performed by an electronic function, and a plot 262 shows a current-voltage characteristic of the organic element after the data writing is performed by the electronic function. It is seen from FIG. 8 that the current-voltage characteristic of the organic element largely changes between before and after the data writing. For example, in the case of an input voltage of 1 V, a current value before the data writing is $4.8 \times 10^{-5}$ mA while a current value after the data writing is $1.1 \times 10^2$ mA; the current value changes by seven digits between before and after the data writing.

As described above, the resistance value of the organic element changes between before and after data writing. By reading out this change of the resistance value of the organic element from a voltage value or a current value, the organic element can be used as a memory circuit.

In the case where such an organic element is used as a memory circuit, a predetermined voltage value (which is not high enough to short) is applied to the organic element everytime data reading-out operation is performed, and the resistance value thereof is read out. Therefore, it is required that the current-voltage characteristic of the organic element be not affected by the repeated reading-out operations, namely the repeatedly-applied predetermined voltage value.

Therefore, a measurement result of the current-voltage characteristic of the organic element after data reading-out operation is performed is described with reference to FIG. 9.

In this experiment, the current-voltage characteristic of the organic element was measured per data reading-out operation. The data reading-out operation was performed 5 times in total, thus the measurement of the current-voltage characteristic of the organic element was also performed 5 times in total. In addition, the measurement of the current-voltage characteristic is performed for two organic elements which are the organic element with the changed resistance value after data writing is performed by an electronic function and the organic element with the unchanged resistance value.

Figure 9:
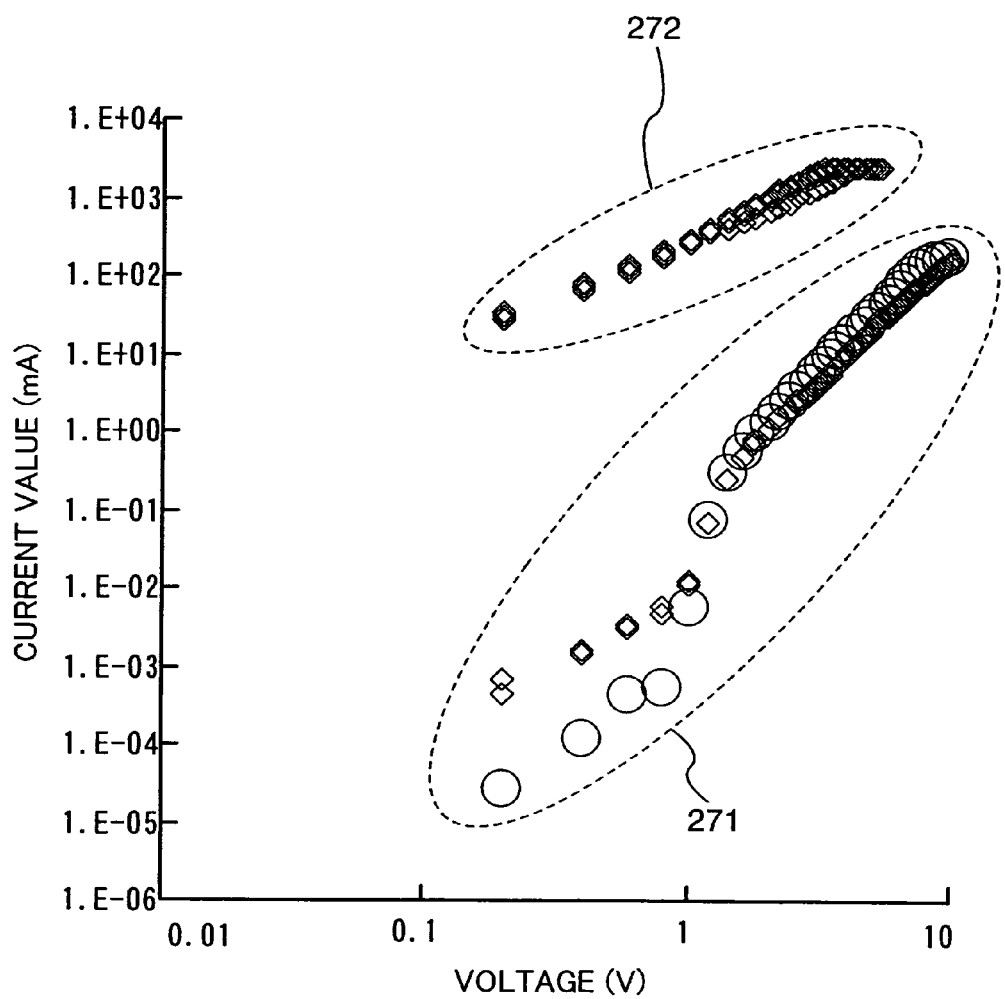
FIG. 9 is a diagram showing data on an organic element of the invention.

In FIG. 9, the abscissa indicates a voltage value, the ordinate indicates a current value, a plot 272 shows a current-voltage characteristic of the organic element with the changed resistance value after data writing is performed by an electronic function, and a plot 271 shows a current-voltage characteristic of the organic element with the unchanged current value.

As is seen from the plot 271, the current-voltage characteristic of the organic element with the unchanged resistance value exhibits the good reproducibility in the case where the voltage value is 1 V or higher. Similarly, as is seen from the plot 272, the current-voltage characteristic of the organic element with the changed resistance value exhibits the good reproducibility in the case where the voltage value is 1 V or higher.

According to the above-described result, it is found that the current-voltage characteristic does not change even if the data reading-out operation is repeatedly performed. Therefore, the above-described organic element can be used as a memory circuit.

Embodiment 5

Next, for Samples 1 to 6 as shown in FIGS. 28A to 28F each obtained by forming an organic element over a substrate, a measurement result of the current-voltage characteristic in the case where data writing is electrically performed to the organic element is shown in FIGS. 25 to 27. It is to be noted here that the writing is performed by applying a voltage to the organic element to short the organic element. The total thickness of an organic compound layer thereof is 5 to 60 nm, and preferably 10 to 20 nm. In addition, the conductivity of each organic compound layer is in the range of $10^{-15}$ to $10^{-3}$ S/cm$^{-1}$.

In FIGS. 25 to 27, the abscissa indicates a voltage, the ordinate indicates a current density value, a plot shown using a circle shows a measurement result of a current-voltage characteristic of the organic element before the data writing, and a plot shown using a square shows a measurement result of a current-voltage characteristic of the organic element after the data writing. Each size of Samples 1 to 6 on the horizontal plane is 2 mm×2 mm.

Figure 25A:
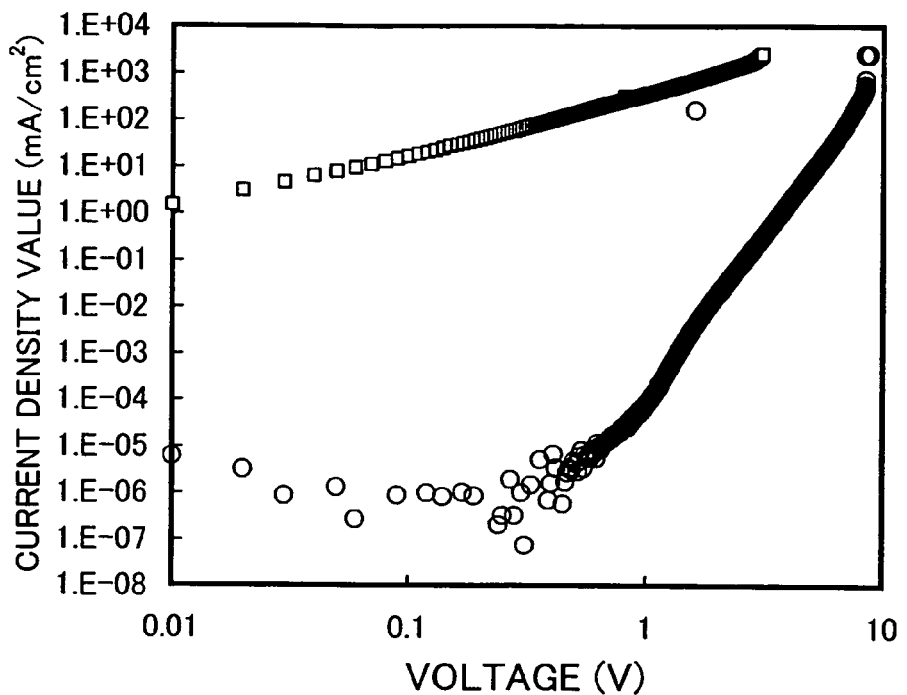
FIGS. 25A and 25B are diagrams each showing data on an organic element of the invention.
Figure 28A:
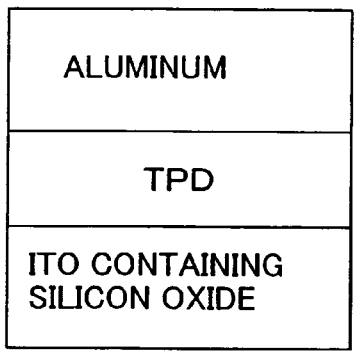
FIGS. 28A to 28F are diagrams each showing a stacked-layer structure of an organic element of the invention.

Sample 1 is an element in which a first conductive layer, a first organic compound layer, and a second conductive layer are stacked in this order. Herein, as shown in FIG. 28A, the first conductive layer is formed using ITO containing silicon oxide, the first organic compound layer is formed using TPD, and the second conductive layer is formed using aluminum. In addition, the first organic compound layer is formed with a thickness of 50 nm. A measurement result of the current-voltage characteristic of Sample 1 is shown in FIG. 25A.

Figure 25B:
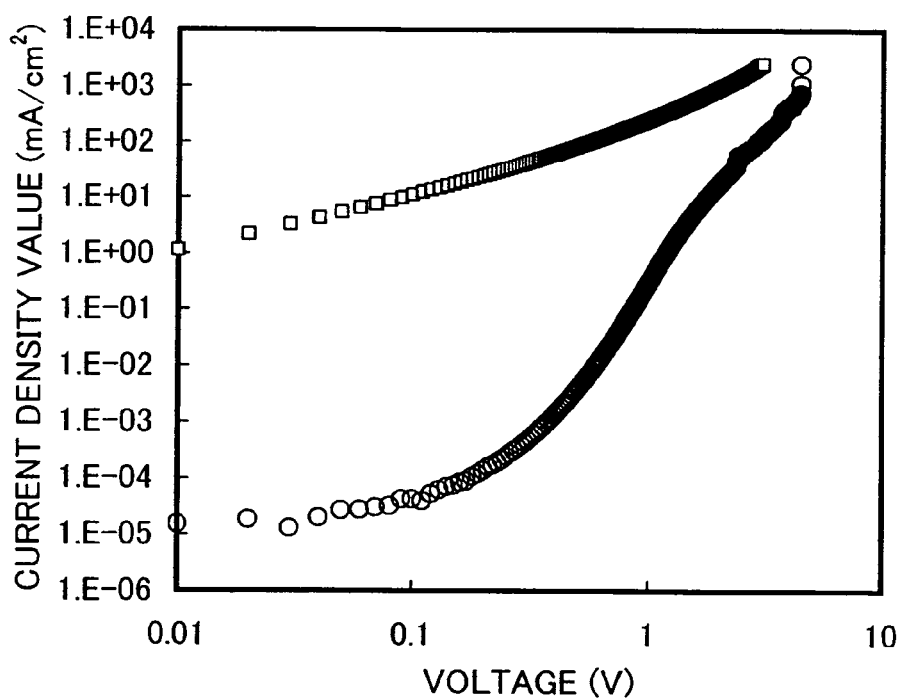
Figure 28B:
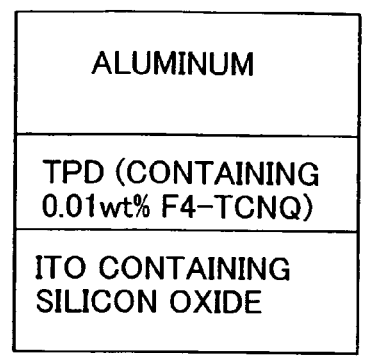

Sample 2 is an element in which a first conductive layer, a first organic compound layer, and a second conductive layer are stacked in this order. Herein, as shown in FIG. 28B, the first conductive layer is formed using ITO containing silicon oxide, the first organic compound layer is formed using TPD to which 2,3,5,6-tetrafluoro-7,7,8,8,-tetracyanoquinodimethane (it may be abbreviated to F4-TCNQ) is added, and the second conductive layer is formed using aluminum. In addition, the first organic compound layer is formed with a thickness of 50 nm and with F4-TCNQ added by 0.01 wt %. A measurement result of the current-voltage characteristic of Sample 2 is shown in FIG. 25B.

Figure 26A:
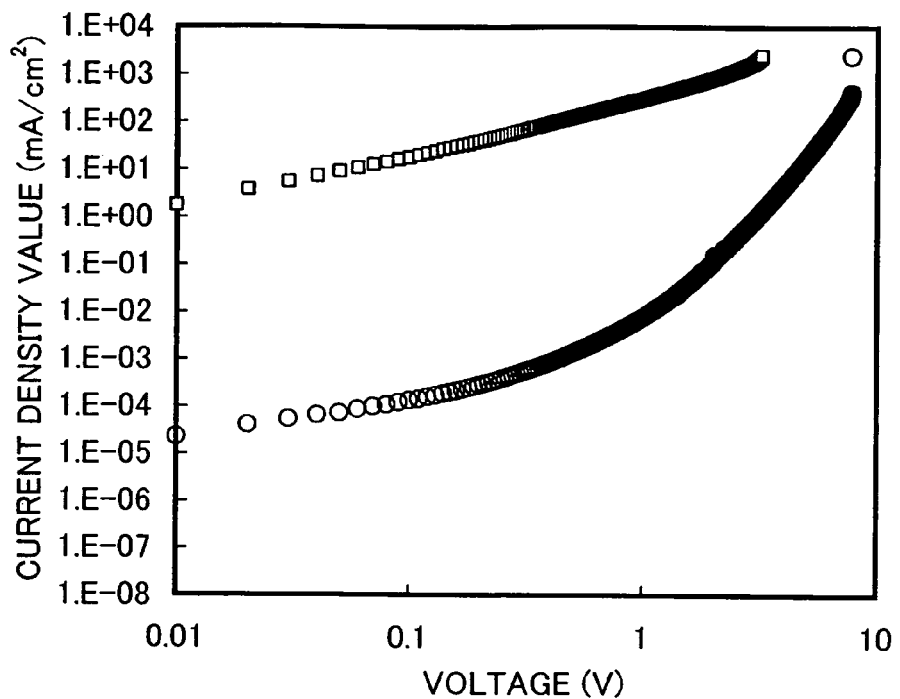
FIGS. 26A and 26B are diagrams each showing data on an organic element of the invention.
Figure 28C:
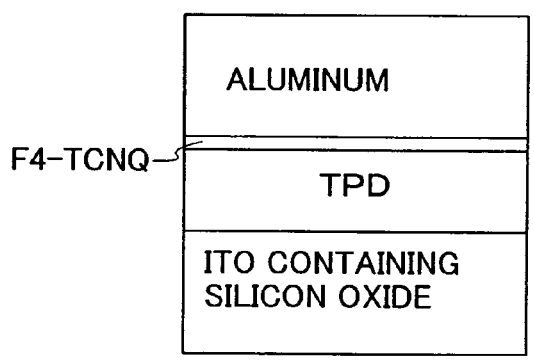

Sample 3 is an element in which a first conductive layer, a first organic compound layer, a second organic compound layer, and a second conductive layer are stacked in this order. Herein, as shown in FIG. 28C, the first conductive layer is formed using ITO containing silicon oxide, the first organic compound layer is formed using TPD, the second organic compound layer is formed using F4-TCNQ, and the second conductive layer is formed using aluminum. In addition, the first organic compound layer is formed with a thickness of 50 nm and the second organic compound layer is formed with a thickness of 1 nm. A measurement result of the current-voltage characteristic of Sample 3 is shown in FIG. 26A.

Figure 26B:
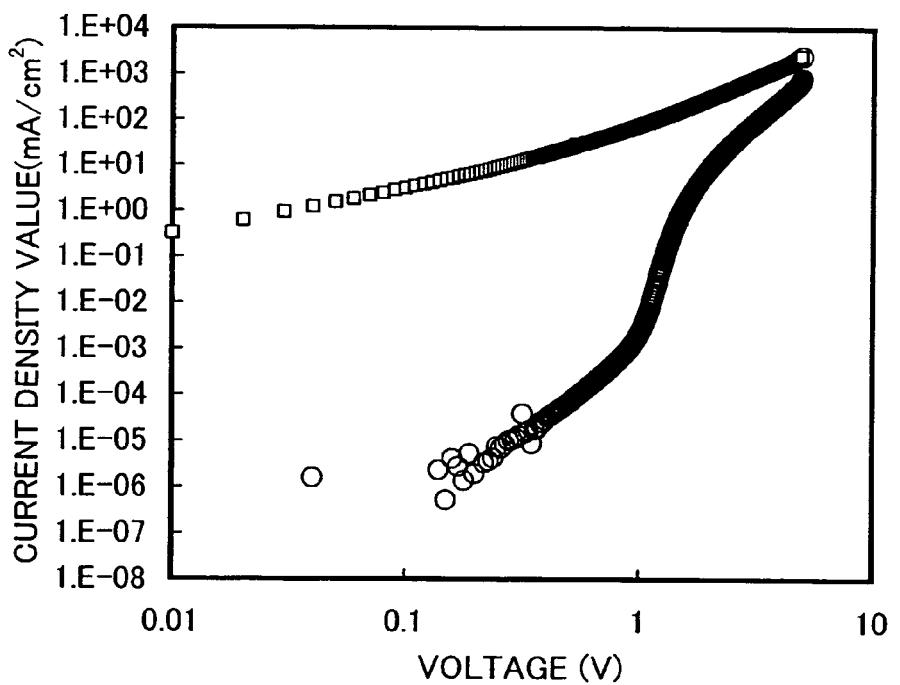
Figure 28D:
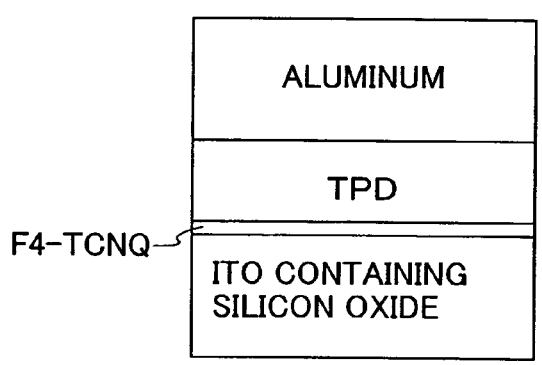

Sample 4 is an element in which a first conductive layer, a first organic compound layer, a second organic compound layer, and a second conductive layer are stacked in this order. Herein, as shown in FIG. 28D, the first conductive layer is formed using ITO containing silicon oxide, the first organic compound layer is formed using F4-TCNQ, the second organic compound layer is formed using TPD, and the second conductive layer is formed using aluminum. In addition, the first organic compound layer is formed with a thickness of 1 nm and the second organic compound layer is formed with a thickness of 50 nm. A measurement result of the current-voltage characteristic of Sample 4 is shown in FIG. 26B.

Figure 27A:
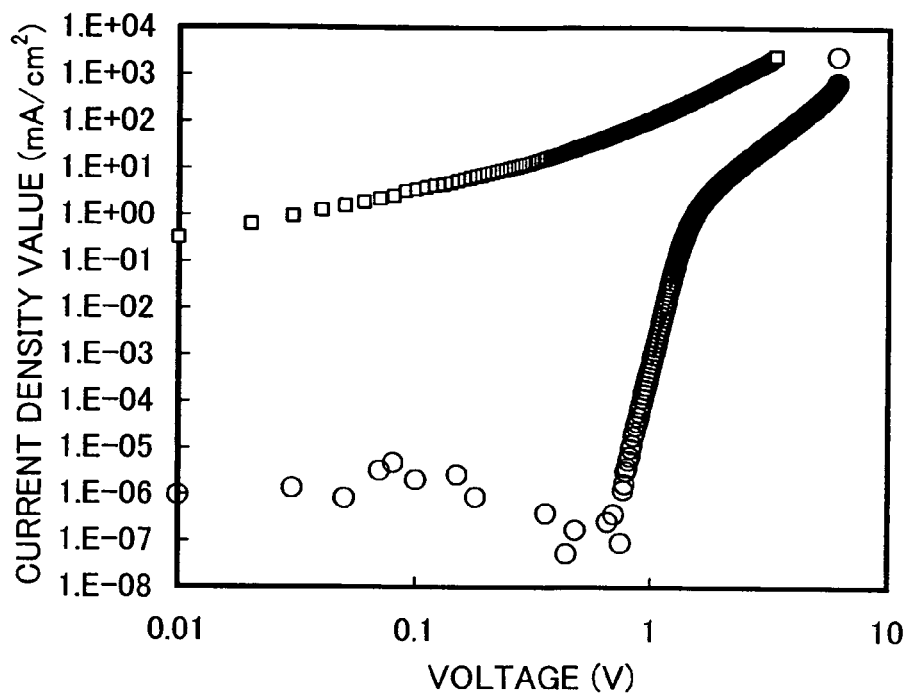
FIGS. 27A and 27B are diagrams each showing data on an organic element of the invention.
Figure 28E:
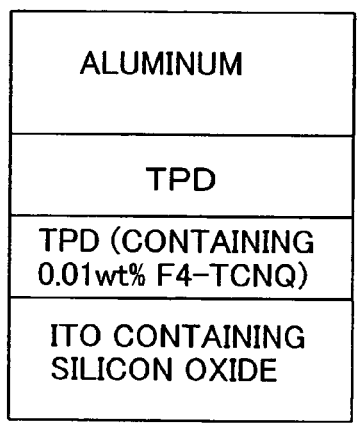

Sample 5 is an element in which a first conductive layer, a first organic compound layer, a second organic compound layer, and a second conductive layer are stacked in this order. Herein, as shown in FIG. 28E, the first conductive layer is formed using ITO containing silicon oxide, the first organic compound layer is formed using TPD to which F4-TCNQ is added, the second organic compound layer is formed using TPD, and the second conductive layer is formed using aluminum. In addition, the first organic compound layer is formed with a thickness of 40 nm and with F4-TCNQ added by 0.01 wt %. The second organic compound layer is formed with a thickness of 40 nm. A measurement result of the current-voltage characteristic of Sample 5 is shown in FIG. 27A.

Figure 27B:
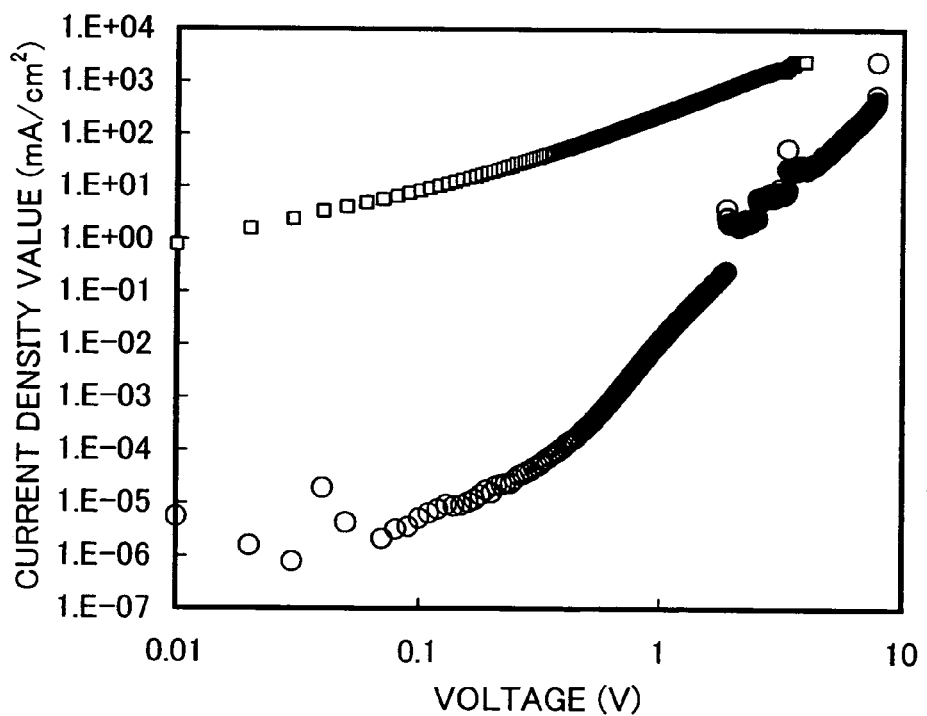
Figure 28F:
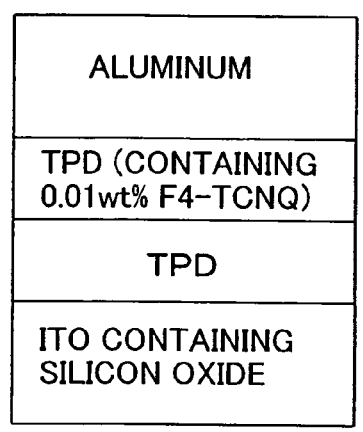

Sample 6 is an element in which a first conductive layer, a first organic compound layer, a second organic compound layer, and a second conductive layer are stacked in this order. Herein, as shown in FIG. 28F, the first conductive layer is formed using ITO containing silicon oxide, the first organic compound layer is formed using TPD, the second organic compound layer is formed using TPD to which F4-TCNQ is added, and the second conductive layer is formed using aluminum. In addition, the first organic compound layer is formed with a thickness of 40 nm. The second organic compound layer is formed with a thickness of 40 nm and with F4-TCNQ added by 0.01 wt %. A measurement result of the current-voltage characteristic of Sample 6 is shown in FIG. 27B.

According to the experimental results shown in FIGS. 25 to 27 also, for Samples 1 to 6, the current-voltage characteristic of the organic element changed between before the data writing and after the organic element is shorted. Furthermore, in the organic elements of these Samples, there is the reproducibility of a voltage to short each organic element as well, and an error of the voltage is within 0.1 V.

Respective characteristics before and after the writing and writing voltages of Samples 1 to 6 are described in Table 1.

TABLE 1

|  | WRITING VOLTAGE (V) | R(1 V) | R(3 V) |
|---|---|---|---|
| SAMPLE 1 | 8.4 | 1.9E+07 | 8.4E+03 |
| SAMPLE 2 | 4.4 | 8.0E+08 | 2.1E+02 |
| SAMPLE 3 | 3.2 | 8.7E+04 | 2.0E+02 |
| SAMPLE 4 | 5.0 | 3.7E+04 | 1.0E+01 |
| SAMPLE 5 | 6.1 | 2.0E+05 | 5.9E+01 |
| SAMPLE 6 | 7.8 | 2.0E+04 | 2.5E+02 |

In Table 1, a writing voltage (V) denotes a voltage applied when each organic element is shorted. R(1V) denotes a value obtained by dividing a current density when a voltage of 1 V is applied to the organic element after the data writing by a current density when a voltage of 1 V is applied to the organic element before the data writing. Similarly, R(3V) denotes a value obtained by dividing a current density when a voltage of 3 V is applied to the organic element after the data writing by a current density when a voltage of 3 V is applied to the organic element before the data writing. That is, they show the change of the current density of each organic element between before and after the data writing. It can be seen that the case of applying 1 V has a current density difference of the fourth power of 10 or more, of the organic element, as compared to the case where the applied voltage is 3 V.

Embodiment 6

Figure 20A:
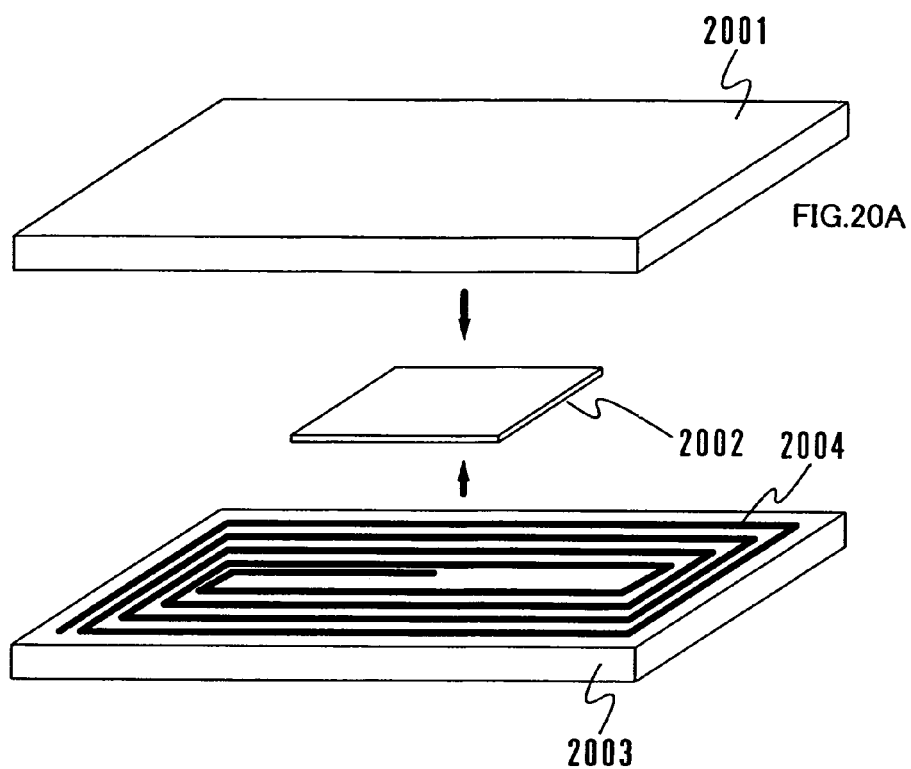
FIGS. 20A and 20B are diagrams of a semiconductor device of the invention which is combined with a protective layer.

An example of forming a flexible ID tag by using a peeling process is described with reference to FIGS. 20A and 20B. The ID tag is structured by flexible protective layers 2001 and 2003, and an ID chip 2002 formed by using a peeling process. In this embodiment, an antenna 2004 is formed not over the ID chip 2002 but over the protective layer 2003 and is electrically connected to the ID chip 2002. In FIG. 20A, the antenna is formed only over the protective layer 2003, however, it may be formed over the protective layer 2001 as well. The antenna is preferably formed using silver, copper, or a metal plated with them. The ID chip 2002 and the antenna are connected with an anisotropic conductive film by UV treatment, however, the invention is not limited to this connection method.

Figure 20B:
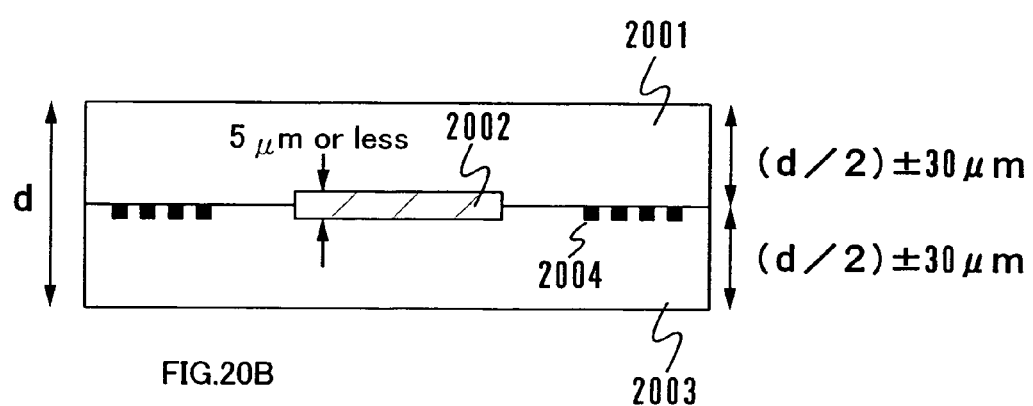

FIG. 20B shows a cross section of FIG. 20A. The ID chip 2002 has a thickness of 5 μm or less, and desirably 0.1 to 3 μm. Further, each of the protective layers 2001 and 2003 preferably has a thickness of (d/2)±30 μm and more preferably (d/2)±10 μm given that the thickness of a stack of the protective layers 2001 and 2003 is d. It is preferable that the protective layers 2001 and 2003 have a thickness of 10 to 200 μm. The ID chip 2002 has an area of 5 mm square or less, and preferably 0.3 to 4 mm square.

Each of the protective layers 2001 and 2003 is formed using an organic resin material and has a structure exhibiting high resistance against bending. Since the ID chip 2002 itself formed by using a peeling process is also highly resistant against bending compared to a single crystalline semiconductor, it can be closely attached to the protective layers 2001 and 2003. The ID chip surrounded by the protective layers 2001 and 2003 may be provided over the surface of another object or inside thereof. Alternatively, it may be embedded into paper.

Embodiment 7

Figure 19:
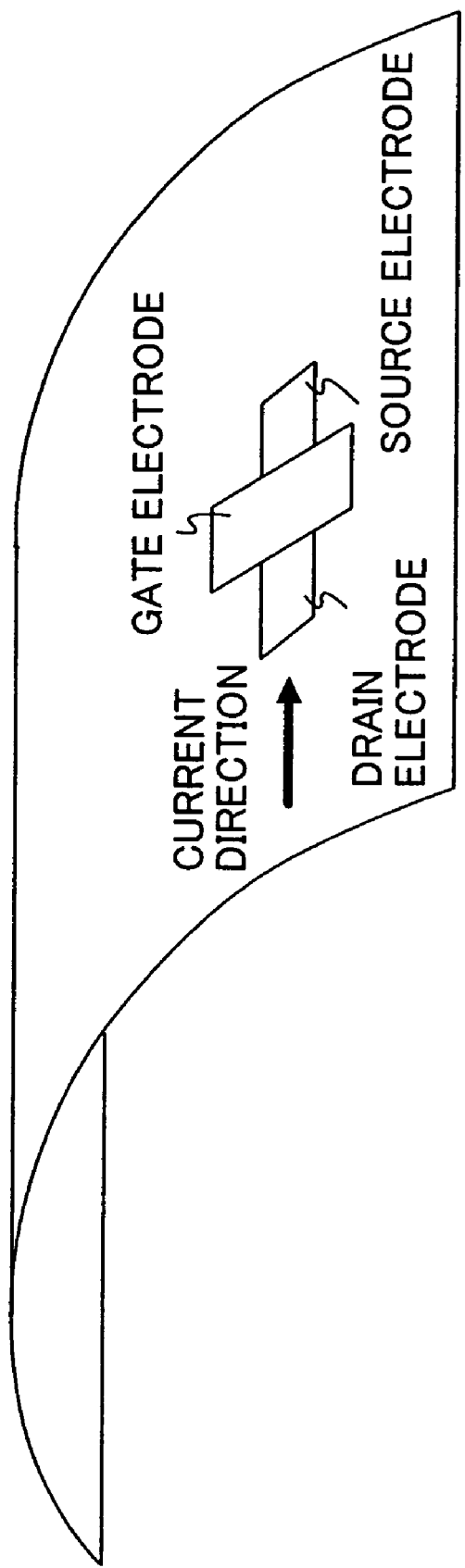
FIG. 19 is a diagram showing an arrangement of a TFT according to the invention.

Described with reference to FIG. 19 is the case where an ID chip is attached to a curved surface, that is, the case where a TFT is arranged perpendicularly to a curving direction of the ID chip. A TFT included in the ID chip of FIG. 19 is arranged in a direction of current flow, that is, a drain electrode, a gate electrode, and a source electrode thereof are arranged linearly so as to suppress an effect of stress. With such an arrangement, variations in characteristics of the TFT can be suppressed. Further, crystals which form the TFT are aligned in the direction of current flow. By forming the crystals using CWLC and the like, the S value can be 0.35 V/dec or lower (preferably 0.09 to 0.25 V/dec) and the mobility can be 100 $cm^2$/Vs or higher. In the case of forming a 19-stage ring oscillator using such TFTs, an oscillating frequency thereof is 1 MHz or higher, and preferably 100 MHz or higher with a power source voltage of 3 to 5 V. With the power source voltage of 3 to 5 V, the delay time per stage of an inverter is 26 ns, and preferably 0.26 ns or shorter.

Further, it is desirable that an active region (silicon island portion) of an active element such as a TFT occupy 5 to 50% of an entire area in order not to destroy the active element due to stress. In a region where no active element such as a TFT exists, a base insulating material, an interlayer insulating material and a wiring material are mainly provided. It is preferable that an area except for the active region of the TFT be 60% or larger of an entire area. The active region of the active element has a thickness of 20 to 200 nm, typically 40 to 170 nm, and preferably 45 to 55 nm or 145 to 155 nm.

Figure 24A:
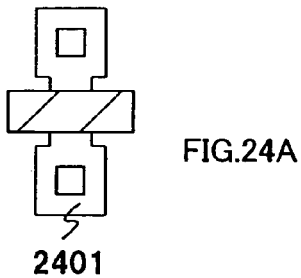
FIGS. 24A to 24E are diagrams each showing a TFT arrangement according to the invention.
Figure 24B:
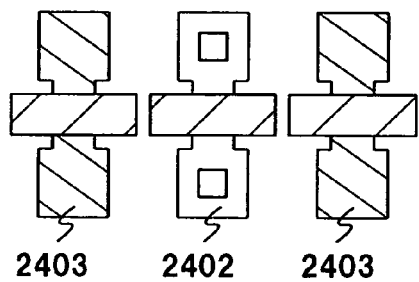
Figure 24C:
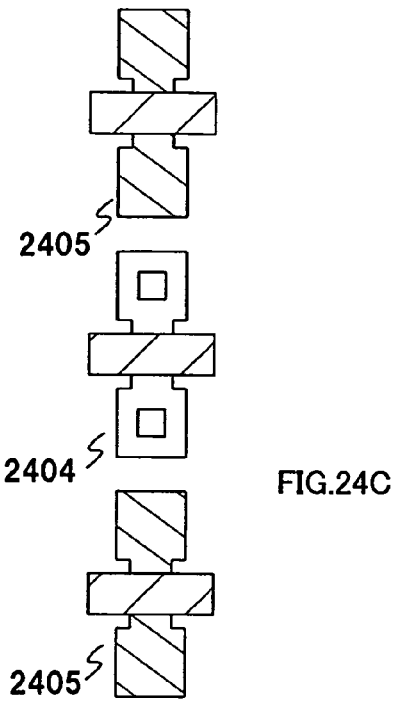
Figure 24D:
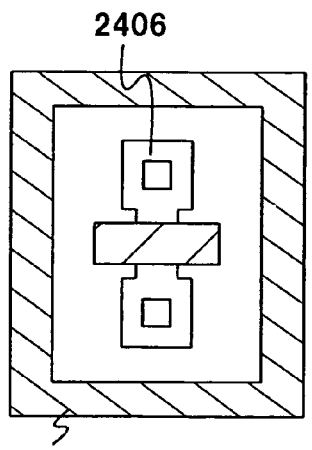
Figure 24E:
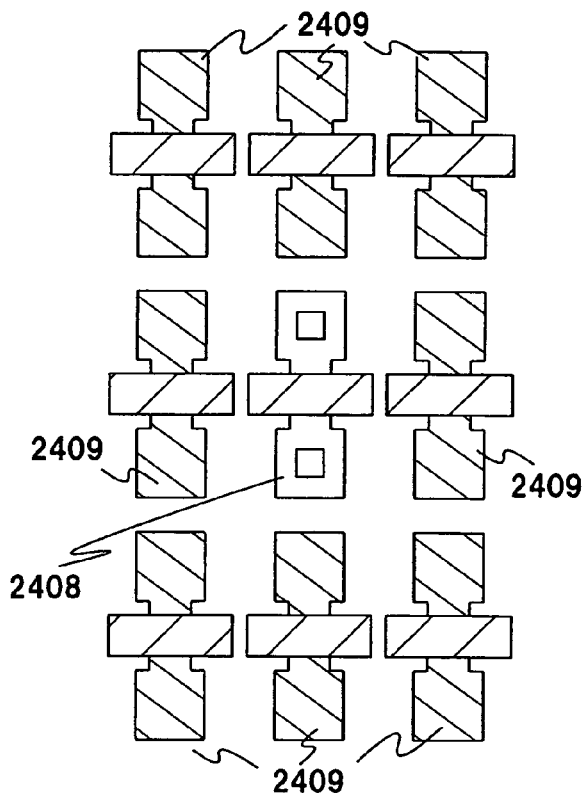

In addition, if a TFT 2401 is provided alone or nearly alone in a semiconductor device (FIG. 24A), the TFT tends to be destroyed due to static electricity or stress in the peeling process if provided. In view of this, by providing a dummy pattern using silicon, metal or the like or a dummy TFT around the TFT as shown in FIGS. 24B to 24E, the destroying due to static electricity or stress can be prevented. FIG. 24B shows a case where a dummy TFT 2403 is provided right and left of a TFT 2402. FIG. 24C shows a case where a dummy TFT 2405 is provided above and below a TFT 2404. FIG. 24D shows a case where a dummy pattern 2407 is provided around a TFT 2406. FIG. 24E shows a case where a dummy TFT 2409 is provided in the four directions of a TFT 2408.

In addition, in the case where a surface of the object is curved and thereby a support base of the ID chip stuck to the curved surface is curved so as to have a curved surface along a generating line such as a conical surface or a columnar surface, it is preferable that a moving direction of carriers of the TFT be made to be the same as the direction of the generating line. According to the aforementioned structure, it can be suppressed that the characteristics of the TFT are affected by the curved support base. Moreover, by forming an island-shaped semiconductor film to occupy an area of 1 to 30% in the integrated circuit, it can be further suppressed that the characteristics of the TFT are affected by the curved support base. This embodiment can be implemented in combination with any of the above embodiment modes and the other embodiments.

Embodiment 8

In this embodiment, examples of the case where an external antenna is provided to a circuit using the invention are described with reference to FIGS. 10 and 11.

Figure 10A:
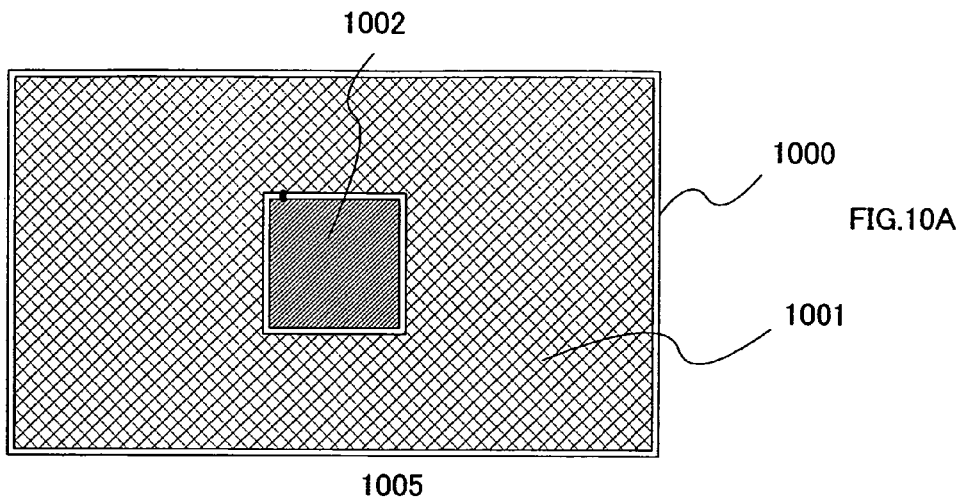
FIGS. 10A to 10E are diagrams each showing an embodiment of an antenna of the invention.

FIG. 10A shows a case where a sheet of antenna covers the periphery of a circuit. An antenna 1001 is formed over a substrate 1000 and a circuit 1002 using the invention is connected thereto. In FIG. 10A, the antenna 1001 covers the periphery of the circuit 1002, however, the antenna may cover the entire surface and the circuit 1002 having electrodes may be attached thereto.

Figure 10B:
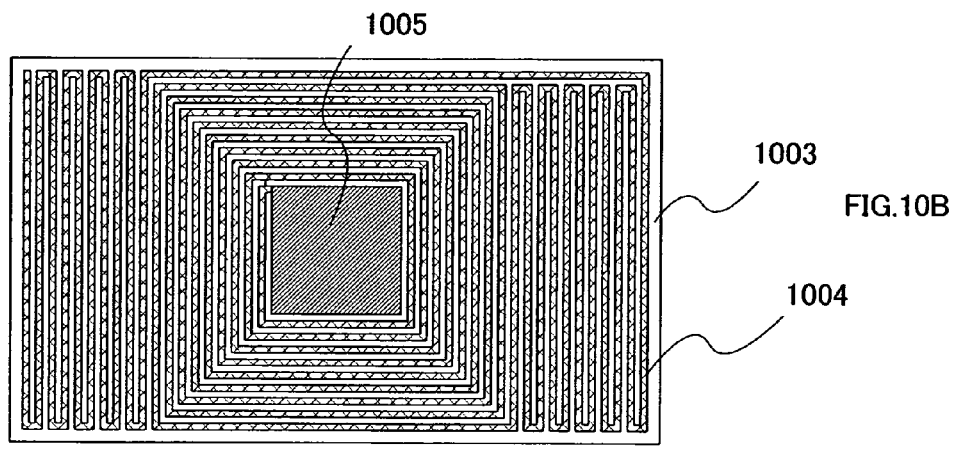

FIG. 10B shows a case where a thin antenna is arranged to circle around a circuit. An antenna 1004 is formed over a substrate 1003 and a circuit 1005 using the invention is connected thereto. Is it to be noted that the wiring of antenna is only an example and the invention is not limited to this.

Figure 10C:
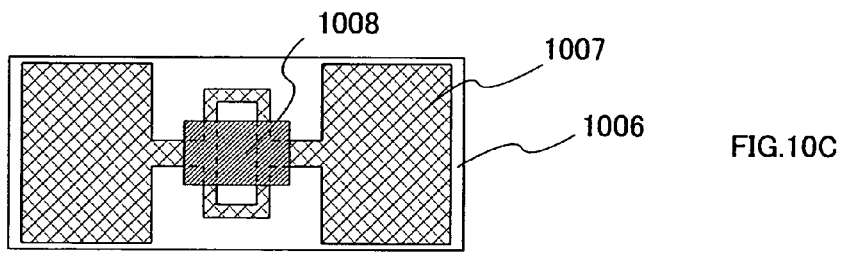

FIG. 10C shows a case where a high frequency antenna is used. An antenna 1007 is formed over a substrate 1006 and a circuit 1008 using the invention is connected thereto.

Figure 10D:
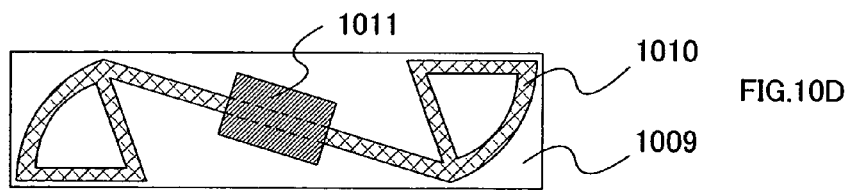

FIG. 10D shows a case where a 180° omnidirectional antenna (capable of receiving signals from any directions) is used. An antenna 1010 is formed over a substrate 1009 and a circuit 1011 using the invention is connected thereto.

Figure 10E:
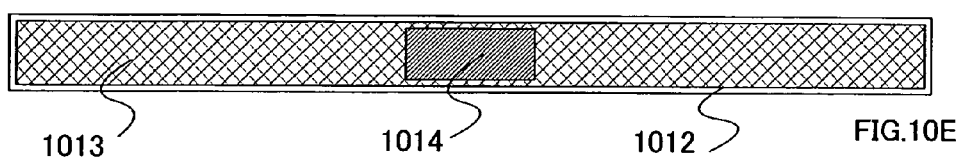

FIG. 10E shows a case where an antenna extended in a stick shape is used. An antenna 1013 is formed over a substrate 1012 and a circuit 1014 using the invention is connected thereto.

A circuit using the invention and the above-described antenna can be connected by a known method. For example, the antenna and the circuit are connected by wire bonding or bump bonding. Alternatively, a circuit chip having an electrode on an entire surface thereof may be attached to the antenna; in this method, an ACF (Anisotropic Conductive Film) can be used to attach.

An appropriate length required for the antenna varies depending on a frequency for receiving signals. In general, the length is favorably a submultiple of a wavelength. For example, in the case where the frequency is 2.45 GHz, the length of the antenna may be about 60 mm (½ wavelength) or about 30 mm (¼ wavelength).

Figures 11A, 11B, 11C:
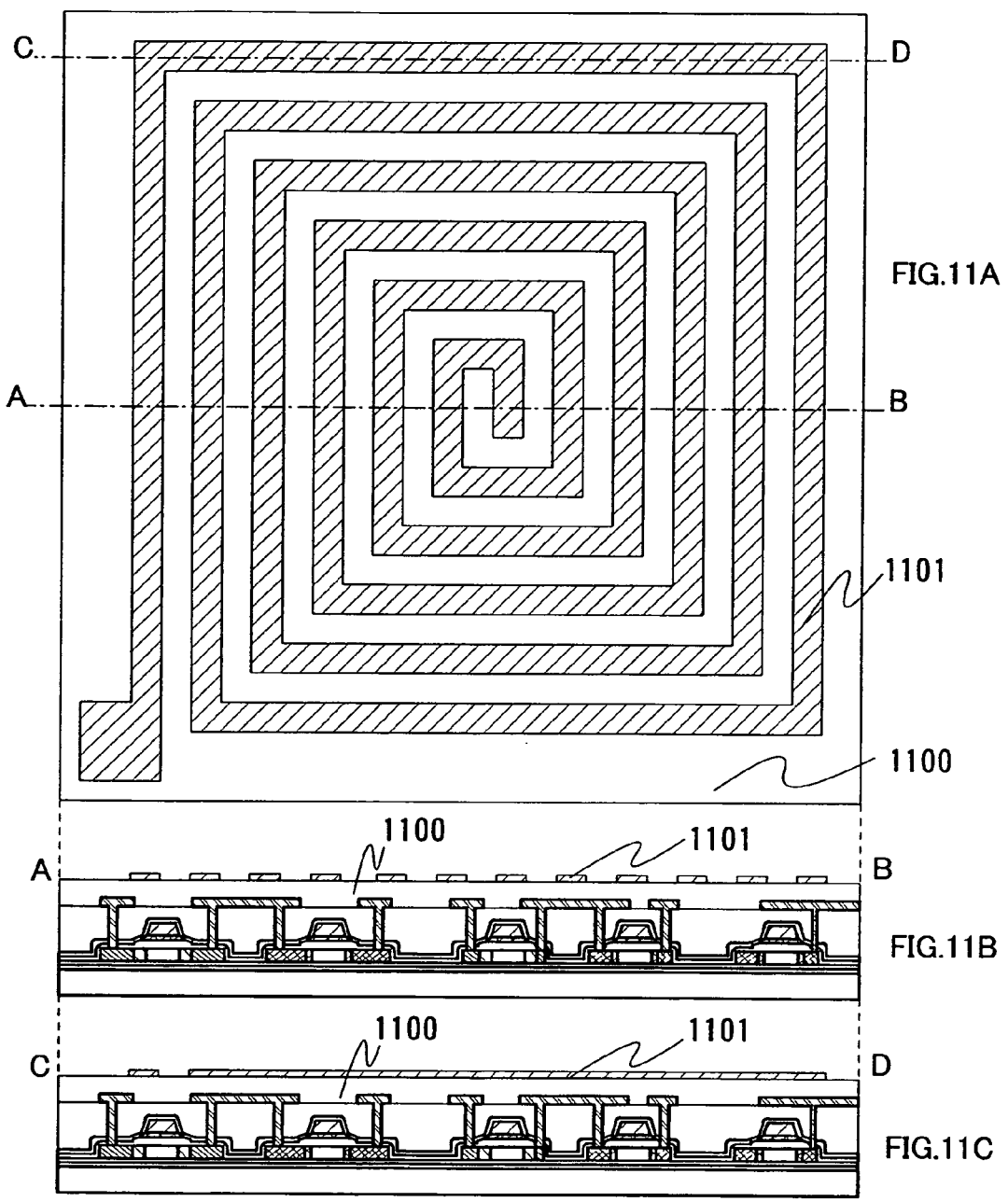
FIGS. 11A to 11C are diagrams showing an embodiment of an antenna of the invention.
Figure 12:
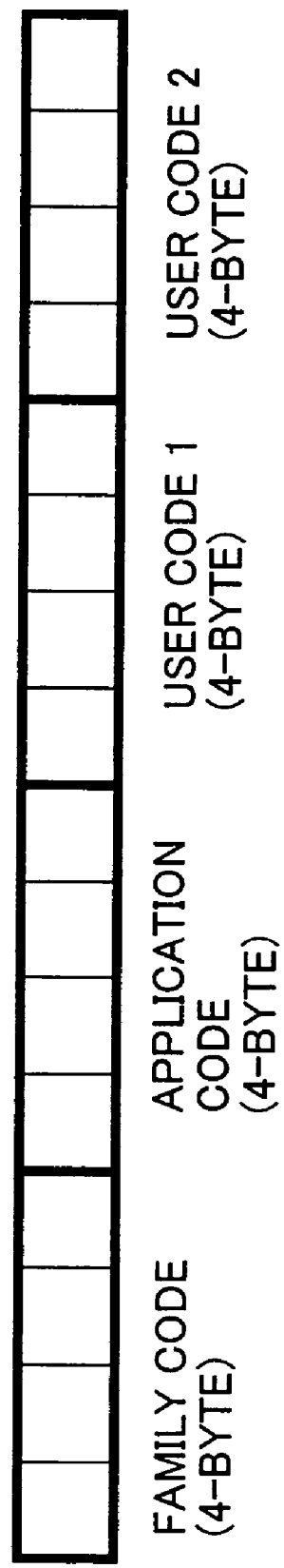
FIG. 12 is a diagram showing an example of data stored in a memory circuit.

Further, a substrate may be mounted over the circuit of the invention and an antenna may be formed thereover. FIGS. 11A to 11C show a top plan view and cross sectional views of an example thereof in which a substrate is mounted over the circuit and a spiral antenna is provided. Reference numeral 1100 denotes an upper substrate and 1101 denotes an antenna wiring.

It is to be noted that the example shown in this embodiment is only an example and a shape of the antenna is not limited. The invention can be implemented with any shape of antenna. This embodiment can be implemented by using any combination of the above embodiment modes and Embodiments 1 to 6.

Embodiment 9

In this embodiment, a semiconductor device of the invention can be applied to an IC card, an IC tag, an RFID, a transponder, paper money, valuable securities, a passport, an electronic device, a bag, and clothes. Examples of an IC card, an ID tag, an ID chip, and the like are described with reference to FIGS. 18A to 18H.

Figure 18A:
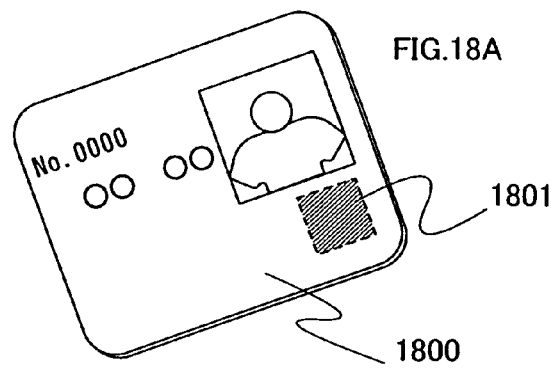
FIGS. 18A to 18H are views of final products of the invention.

FIG. 18A illustrates an IC card which can be used for identification of an individual, or as a credit card or electronic money with which payment can be made without using cash by utilizing a rewritable memory in an incorporated circuit. A circuit portion 1801 using the invention is incorporated in an IC card 1800.

Figure 18B:
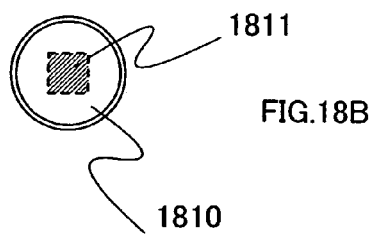

FIG. 18B illustrates an ID tag which can be used for identification of an individual and for management of entrance at a specific place by virtue of its compactness. A circuit portion 1811 using the invention is incorporated in an ID tag 1810.

Figure 18C:
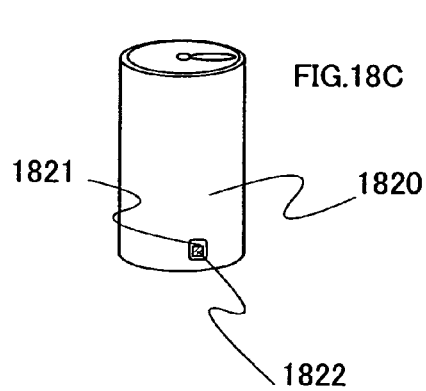

FIG. 18C illustrates a case where an ID chip 1822 is attached to merchandise 1820 for merchandise management at a retail store such as a supermarket. The invention is applied to a circuit in the ID chip 1822. By using the ID chip 1822 in this manner, not only the inventory management is simplified, but also shoplifting and the like can be prevented. In FIG. 18C, a protective film 1821 is provided for adhesion to prevent the ID chip 1822 from being detached, however, the ID chip 1822 may be directly attached to the merchandise 1820 with an adhesive. Moreover, it is preferable that a flexible substrate as mentioned in Embodiment 2 be used for forming the ID chip 1822 in view of attachment to merchandise.

Figure 18D:
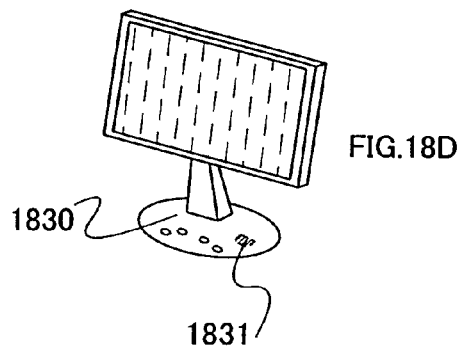

FIG. 18D illustrates a case where an ID chip for recognition is incorporated in merchandise during manufacture. In FIG. 18D, an ID chip 1831 is incorporated in a housing 1830 of a display. The invention is applied to a circuit in the ID chip 1831. With such a structure, recognition of a manufacturer, merchandise distribution management, and the like can be simplified. Note that a housing of a display is taken as an example herein, however, the invention is not limited to this and can be applied to various electronic devices and objects.

Figure 18E:
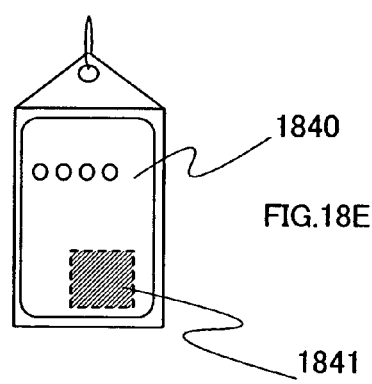

FIG. 18E illustrates a shipping tag for transporting objects. In FIG. 18E, an ID chip 1841 is incorporated in a shipping tag 1840. The invention is applied to a circuit in the ID chip 1841. With such a structure, selection of destination, merchandise distribution management, and the like can be simplified. Note that the shipping tag is fastened to a string for tying up an object herein, however, the invention is not limited to this and the tag may be directly attached to an object with a sealing material or the like.

Figure 18F:
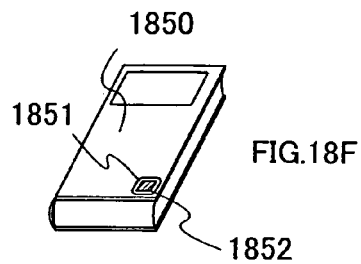

FIG. 18F illustrates a book 1850 incorporating an ID chip 1852. The invention is applied to a circuit in the ID chip 1852. With such a structure, distribution management at a bookstore, circulation management at a library, and the like can be simplified. In FIG. 18F, a protective film 1851 is used for adhesion to prevent the ID chip 1852 from being detached, however, the ID chip 1852 may be directly attached with an adhesive or incorporated in a book cover of the book 1850.

Figure 18G:
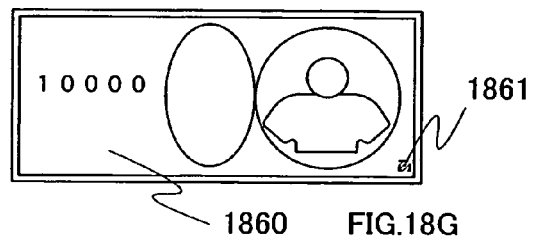

FIG. 18G illustrates paper money 1860 incorporating an ID chip 1861. The invention is applied to a circuit in the ID chip 1861. With such a structure, circulation of counterfeit paper money can be easily prevented. It is to be noted that the ID chip 1861 is preferably embedded in the paper money 1860 in order to prevent the ID chip 1861 from being detached due to the nature of paper money. The invention can be applied to an object made of paper such as valuable securities and a passport as well as paper money.

Figure 18H:
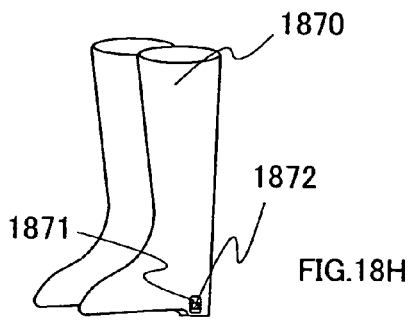

FIG. 18H illustrates shoes 1870 incorporating an ID chip 1872. The invention is applied to a circuit in the ID chip 1872. With such a structure, recognition of a manufacturer, merchandise distribution management, and the like can be simplified. In FIG. 18H, a protective film 1871 is provided for adhesion to prevent the ID chip 1872 from being detached, however, the ID chip 1872 may be directly attached with an adhesive or embedded in the shoes 1870. The invention can be applied to a wearable object such as clothes and a bag as well as shoes.

The case where an ID chip is set to various objects in order to protect the security is described next. The security protection can be considered from the viewpoint of exclusion of theft or exclusion of counterfeit.

Figure 13:
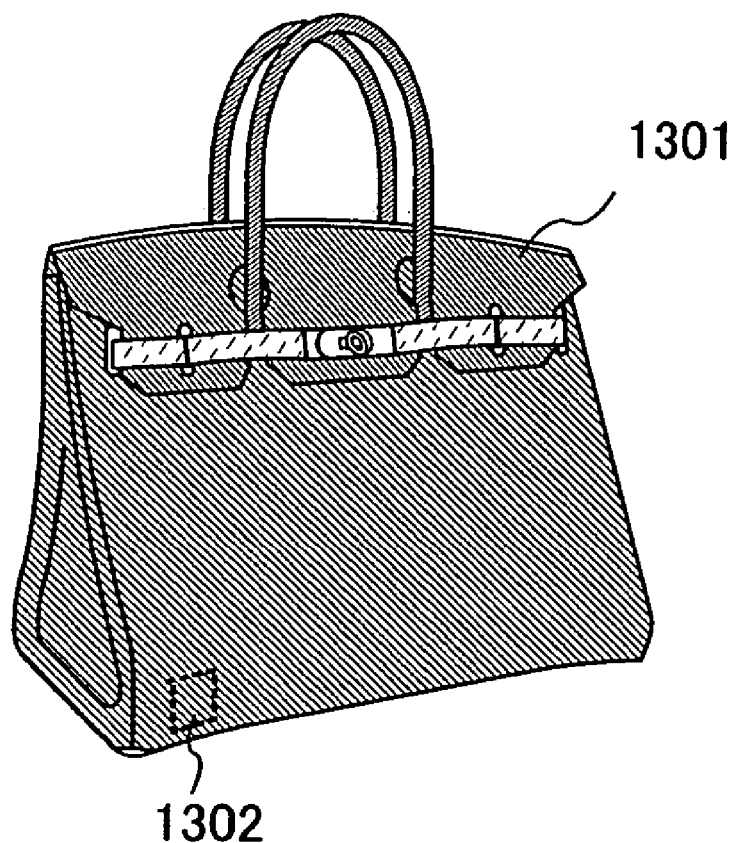
FIG. 13 is a view of a bag using the invention.

The case where an ID chip is set to a bag is described as an example of exclusion of theft. As shown in FIG. 13, an ID chip 1302 is set to a bag 1301. For example, the ID chip 1302 can be set to a part of the bottom or side of the bag 1301. The ID chip 1302 that is very thin and compact can be set without spoiling the design of the bag 1301. Moreover, the ID chip 1302 has translucency, which makes it difficult for a stealer to judge whether the ID chip 1302 is set or not. Therefore, the ID chip 1302 is scarcely detached by the stealer.

When such bag provided with an ID chip is stolen, data on a present position of the bag can be obtained using GPS (Global Positioning System), for example. Note that GPS is a positioning system utilizing a time difference obtained by receiving a signal from a GPS satellite.

As for an object left behind or lost as well as a stolen object, data on the present position can be obtained using GPS.

An ID chip can also be set to a vehicle such as an automobile and a bicycle, a watch, or an accessory as well as a bag.

Next, as an example of the exclusion of counterfeit, a case where an ID chip is set to a passport, a certificate, or the like is described.

Figure 14A:
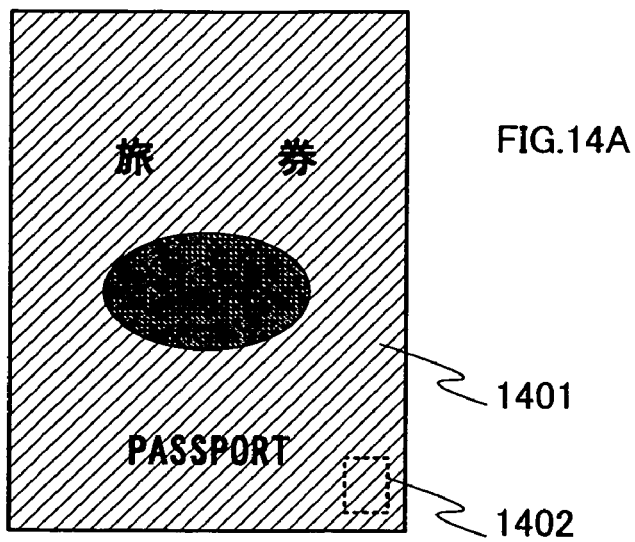
FIGS. 14A and 14B are views of certificates using the invention.

FIG. 14A illustrates a passport 1401 provided with an ID chip. In FIG. 14A, an ID chip 1402 is set to a cover of the passport 1401, however, it may be set to another page or may be set to a surface of the cover since the ID chip 1402 has translucency. Alternatively, the ID chip 1402 may be embedded in the cover by sandwiching with a material for the cover or the like.

Figure 14B:
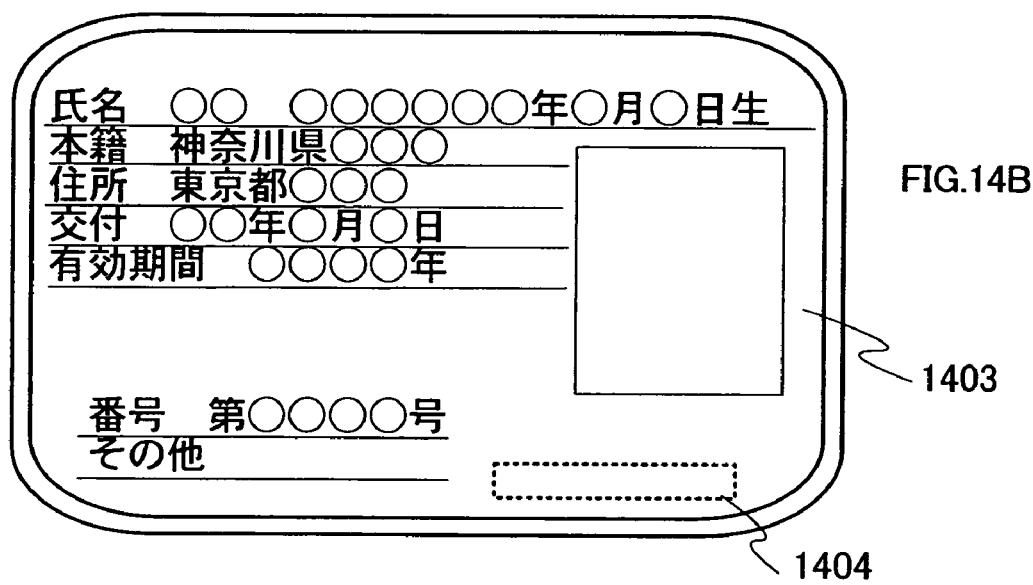

FIG. 14B illustrates a certificate 1403 provided with an ID chip. In FIG. 14B, an ID chip 1404 is embedded in the certificate 1403. The ID chip 1404 which has translucency may be set on a print side of the certificate 1403; for example, the ID chip 1404 is set on the print side of the certificate 1403, and then covered with a film. Alternatively, the ID chip 1404 may be embedded in the certificate 1403 by sandwiching with a material for the certificate 1403.

By setting an ID chip to these objects, counterfeiting thereof can be prevented. In addition, counterfeiting of a bag is also prevented by setting an ID chip thereto. The ID chip that is very thin and compact can be set, thereby the design of a passport, a certificate, or the like is not spoiled. Moreover, the ID chip has translucency, thus it may be set on the surface.

In addition, according to the ID chip, supervision of the passport, the certificate, or the like can be simplified. Moreover data can be stored in the ID chip without writing data directly therein, thereby the privacy can be protected.

Figure 15:
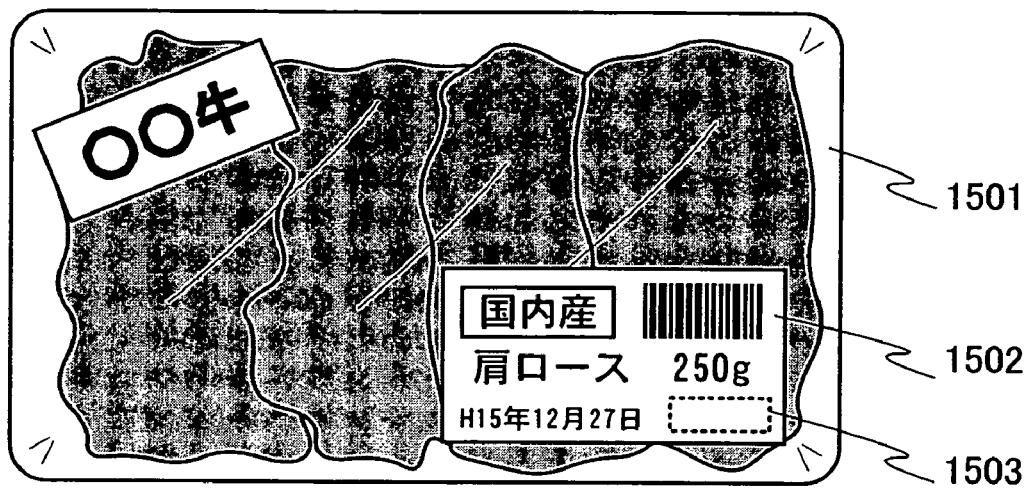
FIG. 15 is a view illustrating grocery control using the invention.

The case where an ID chip is set to merchandise such as groceries for safety control is described with reference to FIG. 15. A label 1502 provided with an ID chip 1503 and a package for meat 1501 on which the label 1502 is attached are shown. The ID chip 1503 may be set on a surface of the label 1502 or embedded in the label 1502. In the case of fresh food such as vegetables, the ID chip may be set to a wrap for the fresh food.

The ID chip 1503 can store basic data on the merchandise such as a place of production, a producer, a pack date, and an expiration date, and application data such as a cooking example using the merchandise. The basic data that is not required to be rewritten is preferably stored in a memory which is not capable of being rewritten such as an MROM or the aforementioned memory using an organic element.

For safety control of groceries, it is also important that states of pre-processed plants and animals can be obtained. In view of this, an ID chip may be preferably embedded in the plants and animals so that data thereon is obtained with a reader device. The data on plants and animals includes a breeding place, feed, a breeder, and the presence of any contagious disease.

Furthermore, if an ID chip stores a price of the merchandise, settlement can be carried out more simply in a shorter time compared to the case of using a barcode as is conventional. That is, plural pieces of merchandise provided with ID chips can be checked out all at once. Note that in the case where a plurality of ID chips are read out in this manner, the reader device is required to have an anti-collision function.

In addition, the settlement of merchandise is possible even when the distance between a register and the merchandise is far, which depends on a communication distance of the ID chip. The ID chip can also serve to prevent shoplifting.

Furthermore, an ID chip can be used in combination with another information medium such as a barcode and a magnetic tape. For example, the basic data that is not required to be rewritten is stored in the ID chip while data to be updated such as data on a discounted price or a special price is stored in the barcode, because data in the barcode can be easily revised unlike the ID chip.

By setting an ID chip as described above, the volume of data for a consumer can be increased, so that the consumer can purchase the merchandise without anxiety.

Figure 16A:
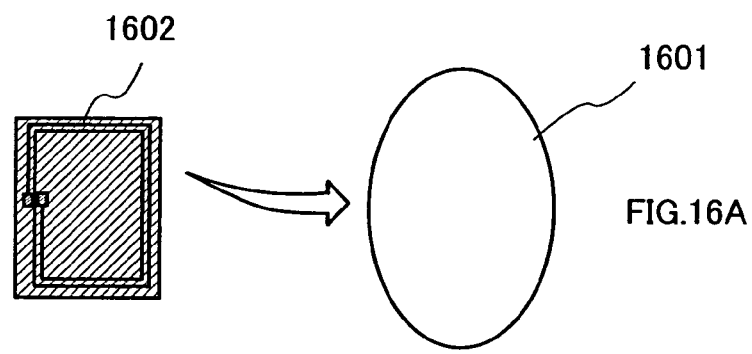
FIGS. 16A and 16B are views illustrating physical distribution management using the invention.
Figure 16B:
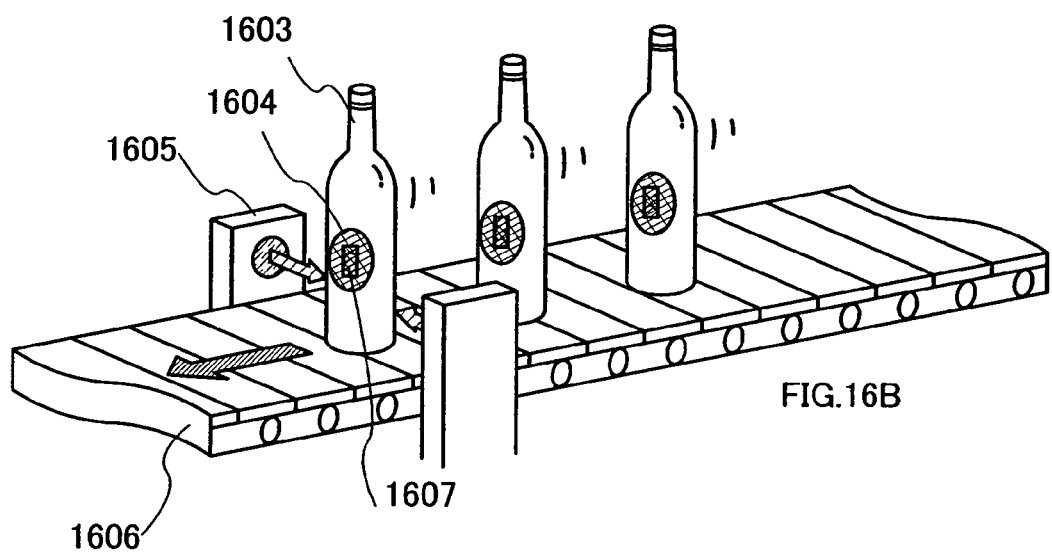

The case where an ID chip is set to merchandise such as a beer bottle for physical distribution management is described below. As shown in FIG. 16A, an ID chip 1602 is set to a beer bottle. For example, the ID chip 1602 may be attached using a label 1601.

The ID chip stores basic data such as a manufactured date, a manufacturing place, and a material thereof. Such basic data is not required to be rewritten, thus it is preferably stored in a memory which is not capable of being rewritten such as an MROM or the aforementioned memory using an organic element. In addition, the ID chip stores individual data such as an address, a date and time for delivery of the beer bottle. For example, the address, the date and time for delivery can be stored in an ID chip 1607 in a label 1604 when a beer bottle 1603 passes through a writer device 1605 with a flow of a belt conveyor 1606. Such individual data is preferably stored using the organic memory of the invention.

In addition, a system may be preferably built such that when data on the purchased merchandise is sent from a shop to a physical distribution management center through network, a writer device, or a personal computer or the like for controlling the writer device calculates an address, a date and time for delivery based on the data on the merchandise, to be stored in the ID chip.

It is also noted that a beer bottle or the like is delivered per case. An ID chip may be set per case or per a plurality of cases to store individual data.

As for a something to drink to which a plurality of addresses for delivery may be stored, time required for manual input can be suppressed by setting an ID chip, thereby input errors due to the manual procedure can be reduced. In addition to this, manpower cost that is the most expensive in the field of the physical distribution management can be reduced. Accordingly, setting of an ID chip enables physical distribution management with less errors at low cost.

Furthermore, application data such as groceries matched well with beer and a recipe using beer can be recorded by a receiver. Consequently, advertisement of the groceries and the like is carried out at the same time, which drives the consumers to purchase. Such application data can be preferably stored in the organic memory of the invention. By setting an ID chip as described above, the volume of data for a consumer can be increased, so that the consumer can purchase the merchandise without anxiety.

An article of manufacture provided with an ID chip and a manufacturing apparatus (a manufacturing robot) controlled based on data on the ID chip for manufacturing control are described next.

Nowadays, original merchandise has been produced in many cases, which is manufactured in accordance with original data on the merchandise on a manufacture line. For example, in a manufacture line of automobiles in which a painting color of doors can be selected appropriately, an ID chip is set at an automobile and a painting apparatus is controlled based on data on the ID chip. Accordingly, an original automobile can be manufactured. As a result of setting an ID chip, the sequence of automobiles to be pumped into the manufacture line and the number of automobiles to have the same color are not required to be controlled in advance. Consequently, any program for controlling the sequence and the number of automobiles, and the painting apparatus so as to correspond to them is not required to be set. That is, the manufacturing apparatus can operate individually based on data on the ID chip that is set to each automobile.

As described above, an ID chip can be used in various places. Individual data on manufacture can be obtained from data stored in the ID chip so that a manufacturing apparatus can be controlled based on the data.

Figure 17:
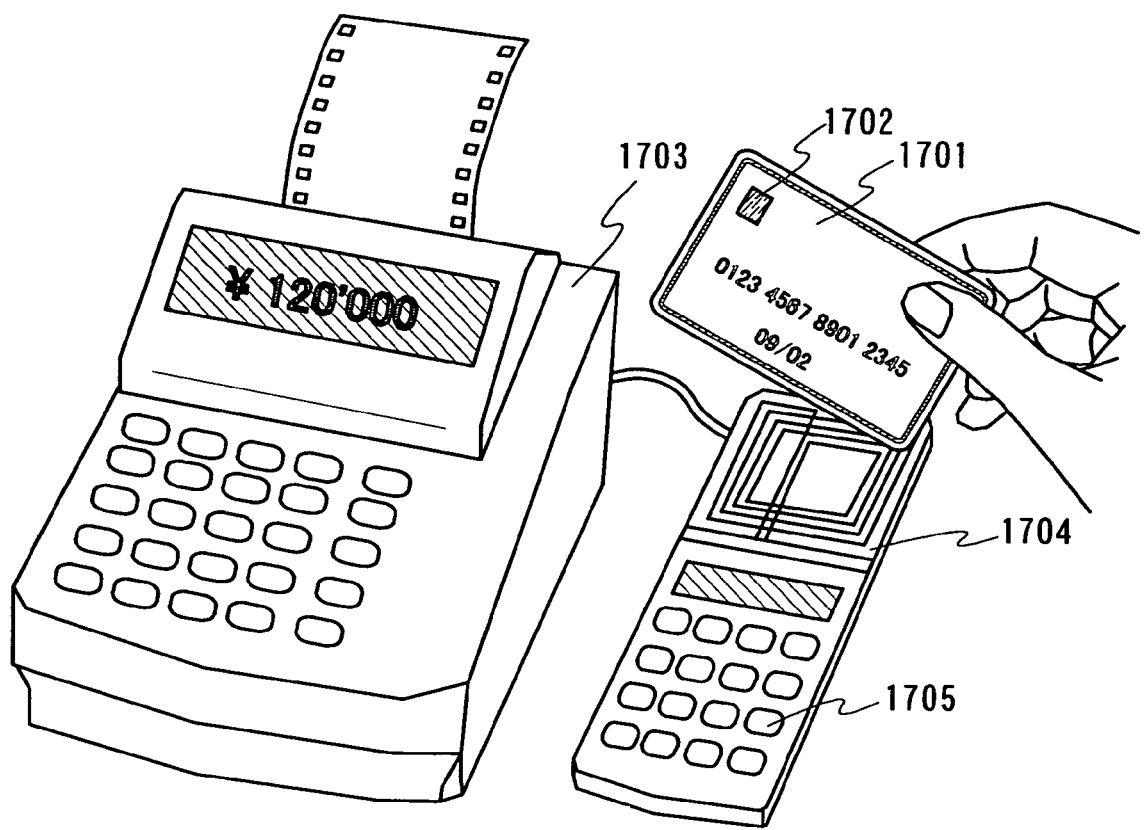
FIG. 17 is a view illustrating payment with an IC card using the invention.

Described next is the case where an IC card using an ID chip of the invention is utilized as electronic money. In FIG. 17, payment is carried out by using an IC card 1701. The IC card 1701 has an ID chip 1702 of the invention. In utilizing the IC card 1701, a register 1703 and a reader/writer 1704 are used. The sum of money of the IC card 1701 is stored in the ID chip 1702, and the data on the sum can be read by a non-contact means by the reader/writer 1704 to be sent to the register 1703. The register 1703 checks that the sum of money in the IC card 1701 is larger than the payment amount, and carries out the payment. Then, data on the remaining amount in the IC card 1701 after the payment is sent to the reader/writer 1704. The reader/writer 1704 can write the data on the remaining amount into the ID chip 1702 of the IC card 1701.

The reader/writer 1704 may be provided with a key 1705 for inputting a password so that unauthorized payment using the IC card 1701 by a third party can be restricted. Note that this embodiment describes only examples and the invention is not limited to these applications.

As set forth above, the application range of the invention is quite wide and the invention can be applied as an individual recognition chip for any product. Further, the invention can be implemented by using any combination of the embodiment modes and Embodiments 1 to 9.

This application is based on Japanese Patent Application serial no. 2004-317398 filed in Japan Patent Office on Oct. 29th, 2004, and the entire contents of which are hereby incorporated by reference.

The invention claimed is:

1. A semiconductor device comprising:
   a plurality of memory cells each having a structure in which one of a source and a drain of a transistor is connected with one terminal of an organic element, and the other of the source and the drain of the transistor is connected with the other terminal of the organic element;
   a plurality of memory cell columns in which the plurality of memory cells are connected in series; and
   a means for detecting a signal of each memory cell column, provided at one end of each of the plurality of memory cell columns,
   wherein the organic element comprises an organic compound layer provided between a pair of conductive layers, and
   wherein the organic compound layer comprises a conjugated polymer doped with a photo-acid generator.

2. A device according to claim 1,
   wherein the organic element has an organic compound layer, and
   wherein the organic compound layer is formed using an electron-transporting material or a hole-transporting material.

3. A device according to claim 1,
   wherein the organic element has an organic compound layer, and
   wherein the organic compound layer contains a material the electric resistance of which is varied when irradiated with light.

4. A device according to claim 2, wherein the organic compound layer varies its conductivity when irradiated with laser light.

5. A device according to claim 1,
   wherein the organic element has an organic compound layer, and
   wherein the organic compound layer contains a material the electric resistance of which is varied when a voltage or a current is applied thereto.

6. A device according to claim 1, wherein the organic element varies its electric resistance irreversibly when data is written thereto.

7. A device according to claim 6, wherein the organic element varies the distance between electrodes thereof when data is written thereto.

8. A device according to claim 1, wherein the conductivity of the organic compound layer is in the range of $10^{-15}$ to $10^{-3}$ S/cm$^{-1}$.

9. A device according to claim 1, wherein the thickness of the organic compound layer is 5 to 60 nm, and preferably 10 to 20 nm.

10. A device according to claim 1, wherein the organic element and the transistor are provided over a semiconductor substrate.

11. A device according to claim 1, wherein the organic element and the transistor are provided over a glass substrate.

12. A device according to claim 1, wherein the organic element and the transistor are provided over a flexible substrate.

13. A device according to claim 1, wherein the organic element and the transistor are provided over an SOI substrate.

14. A device according to claim 1, wherein the transistor includes a thin film transistor.

15. An IC card, an IC tag, an RFID, a transponder, paper money, valuable securities, a passport, an electronic device, a bag, and clothes, each having the semiconductor device according to claim 1.

16. An RFID having the semiconductor device according to claim 1 and having at least one of a power source circuit, a clock generating circuit, a data demodulating circuit, a data modulating circuit, a control circuit, and an interface circuit.

17. A semiconductor device comprising:
   a plurality of memory cells each having a structure in which one of a source and a drain of a transistor is connected with one terminal of an organic element, and the other of the source and the drain of the transistor is connected with the other terminal of the organic element;
   a plurality of memory cell columns in which the plurality of memory cells are connected in series; and
   a means for detecting a signal of each memory cell column, provided at one end of each of the plurality of memory cell columns, so that a NAND memory device is configured, wherein the organic element comprises an organic compound layer provided between a pair of conductive layers, and wherein the organic compound layer comprises a conjugated polymer doped with a photo-acid generator.

18. A device according to claim 17,
wherein the organic element has an organic compound layer, and
wherein the organic compound layer is formed using an electron-transporting material or a hole-transporting material.

19. A device according to claim 17,
wherein the organic element has an organic compound layer, and
wherein the organic compound layer contains a material the electric resistance of which is varied when irradiated with light.

20. A device according to claim 18, wherein the organic compound layer varies its conductivity when irradiated with laser light.

21. A device according to claim 17,
wherein the organic element has an organic compound layer, and
wherein the organic compound layer contains a material the electric resistance of which is varied when a voltage or a current is applied thereto.

22. A device according to claim 17, wherein the organic element varies its electric resistance irreversibly when data is written thereto.

23. A device according to claim 22, wherein the organic element varies the distance between electrodes thereof when data is written thereto.

24. A device according to claim 17, wherein the conductivity of the organic compound layer is in the range of $10^{-15}$ to $10^{-3}$ S/cm$^{-1}$.

25. A device according to claim 17, wherein the thickness of the organic compound layer is 5 to 60 nm, and preferably 10 to 20 nm.

26. A device according to claim 17, wherein the organic element and the transistor are provided over a semiconductor substrate.

27. A device according to claim 17, wherein the organic element and the transistor are provided over a glass substrate.

28. A device according to claim 17, wherein the organic element and the transistor are provided over a flexible substrate.

29. A device according to claim 17, wherein the organic element and the transistor are provided over an SOI substrate.

30. A device according to claim 17, wherein the transistor includes a thin film transistor.

31. An IC card, an IC tag, an RFID, a transponder, paper money, valuable securities, a passport, an electronic device, a bag, and clothes, each having the semiconductor device according to claim 17.

32. An RFID having the semiconductor device according to claim 17 and having at least one of a power source circuit, a clock generating circuit, a data demodulating circuit, a data modulating circuit, a control circuit, and an interface circuit.

* * * * *